United States Patent
Zawodny et al.

(10) Patent No.: US 10,964,358 B2
(45) Date of Patent: *Mar. 30, 2021

(54) APPARATUSES AND METHODS FOR SCATTER AND GATHER

(71) Applicant: Micron Technology, Inc., Boise, ID (US)

(72) Inventors: Jason T. Zawodny, Grand Rapids, MI (US); Kelley D. Dobelstein, Seattle, WA (US); Timothy P. Finkbeiner, Boise, ID (US); Richard C. Murphy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/536,941

(22) Filed: Aug. 9, 2019

(65) Prior Publication Data
US 2019/0362762 A1     Nov. 28, 2019

Related U.S. Application Data

(63) Continuation of application No. 15/669,300, filed on Aug. 4, 2017, now Pat. No. 10,522,199, which is a
(Continued)

(51) Int. Cl.
*G11C 11/4096* (2006.01)
*G11C 11/4091* (2006.01)
(Continued)

(52) U.S. Cl.
CPC ............ *G11C 7/1006* (2013.01); *G06F 3/061* (2013.01); *G06F 3/0659* (2013.01);
(Continued)

(58) Field of Classification Search
CPC . G11C 7/1006; G11C 11/4096; G11C 7/1036; G11C 11/4087; G11C 11/4091;
(Continued)

(56) References Cited

U.S. PATENT DOCUMENTS 4,380,046 A    4/1983   Fung
4,435,792 A    3/1984   Bechtolsheim
(Continued)

FOREIGN PATENT DOCUMENTS

CN    102141905    8/2011
EP    0214718      3/1987
(Continued)

OTHER PUBLICATIONS

"DFI DDR PHY Interface DFI 3.0 Specification," May 2012, Cadence Design Systems, Inc. (Year: 2012).*
(Continued)

*Primary Examiner* — Michael Krofcheck
(74) *Attorney, Agent, or Firm* — Brooks, Cameron & Huebsch, PLLC

(57) ABSTRACT

The present disclosure includes apparatuses and methods related to scatter/gather in a memory device. An example apparatus comprises a memory device that includes an array of memory cells, sensing circuitry, and a memory controller coupled to one another. The sensing circuitry includes a sense amplifier and a compute component configured to implement logical operations. A channel controller is configured to receive a block of instructions, the block of instructions including individual instructions for at least one of a gather operation and a scatter operation. The channel controller is configured to send individual instructions to the memory device and to control the memory controller such that the at least one of the gather operation and the scatter
(Continued)

operation is executed on the memory device based on a corresponding one of the individual instructions.

18 Claims, 9 Drawing Sheets

Related U.S. Application Data continuation of application No. PCT/US2016/015027, filed on Jan. 27, 2016.

(60) Provisional application No. 62/112,843, filed on Feb. 6, 2015.

(51) Int. Cl.
  *G06F 3/06* (2006.01)
  *G11C 7/10* (2006.01)
  *G11C 8/12* (2006.01)
  *G11C 7/06* (2006.01)
  *G11C 11/408* (2006.01)

(52) U.S. Cl.
  CPC .............. *G06F 3/0685* (2013.01); *G11C 7/06* (2013.01); *G11C 7/065* (2013.01); *G11C 7/1036* (2013.01); *G11C 8/12* (2013.01); *G11C 11/4087* (2013.01); *G11C 11/4091* (2013.01); *G11C 11/4096* (2013.01)

(58) Field of Classification Search
  CPC .. G11C 7/065; G11C 8/12; G11C 7/06; G06F 3/061; G06F 3/0659; G06F 3/0685
  See application file for complete search history.

(56) References Cited

U.S. PATENT DOCUMENTS

| | | |
|---|---|---|
| 4,435,793 A | 3/1984 | Ochii |
| 4,727,474 A | 2/1988 | Batcher |
| 4,843,264 A | 6/1989 | Galbraith |
| 4,958,378 A | 9/1990 | Bell |
| 4,977,542 A | 12/1990 | Matsuda et al. |
| 5,023,838 A | 6/1991 | Herbert |
| 5,034,636 A | 7/1991 | Reis et al. |
| 5,201,039 A | 4/1993 | Sakamura |
| 5,210,850 A | 5/1993 | Kelly et al. |
| 5,253,308 A | 10/1993 | Johnson |
| 5,276,643 A | 1/1994 | Hoffman et al. |
| 5,325,519 A | 6/1994 | Long et al. |
| 5,367,488 A | 11/1994 | An |
| 5,379,257 A | 1/1995 | Matsumura et al. |
| 5,386,379 A | 1/1995 | Ali-Yahia et al. |
| 5,398,213 A | 3/1995 | Yeon et al. |
| 5,440,482 A | 8/1995 | Davis |
| 5,446,690 A | 8/1995 | Tanaka et al. |
| 5,459,842 A * | 10/1995 | Begun ................ G06F 13/1631 710/68 |
| 5,473,576 A | 12/1995 | Matsui |
| 5,481,500 A | 1/1996 | Reohr et al. |
| 5,485,373 A | 1/1996 | Davis et al. |
| 5,506,811 A | 4/1996 | McLaury |
| 5,615,404 A | 3/1997 | Knoll et al. |
| 5,638,128 A | 6/1997 | Hoogenboom |
| 5,638,317 A | 6/1997 | Tran |
| 5,654,936 A | 8/1997 | Cho |
| 5,678,021 A | 10/1997 | Pawate et al. |
| 5,724,291 A | 3/1998 | Matano |
| 5,724,366 A | 3/1998 | Furutani |
| 5,751,987 A | 5/1998 | Mahant-Shetti et al. |
| 5,787,458 A | 7/1998 | Miwa |
| 5,794,069 A * | 8/1998 | Chisholm ............. G06F 13/126 709/215 |
| 5,854,636 A | 12/1998 | Watanabe et al. |
| 5,867,429 A | 2/1999 | Chen et al. |
| 5,870,504 A | 2/1999 | Nemoto et al. |
| 5,915,084 A | 6/1999 | Wendell |
| 5,935,263 A | 8/1999 | Keeth et al. |
| 5,986,942 A | 11/1999 | Sugibayashi |
| 5,991,209 A | 11/1999 | Chow |
| 5,991,785 A | 11/1999 | Alidina et al. |
| 6,005,799 A | 12/1999 | Rao |
| 6,009,020 A | 12/1999 | Nagata |
| 6,092,186 A | 7/2000 | Betker et al. |
| 6,122,211 A | 9/2000 | Morgan et al. |
| 6,125,071 A | 9/2000 | Kohno et al. |
| 6,134,164 A | 10/2000 | Lattimore et al. |
| 6,147,514 A | 11/2000 | Shiratake |
| 6,151,244 A | 11/2000 | Fujino et al. |
| 6,157,578 A | 12/2000 | Brady |
| 6,163,862 A | 12/2000 | Adams et al. |
| 6,166,942 A | 12/2000 | Vo et al. |
| 6,172,918 B1 | 1/2001 | Hidaka |
| 6,175,514 B1 | 1/2001 | Henderson |
| 6,181,698 B1 | 1/2001 | Hariguchi |
| 6,208,544 B1 | 3/2001 | Beadle et al. |
| 6,226,215 B1 | 5/2001 | Yoon |
| 6,301,153 B1 | 10/2001 | Takeuchi et al. |
| 6,301,164 B1 | 10/2001 | Manning et al. |
| 6,304,477 B1 | 10/2001 | Nail |
| 6,389,507 B1 | 5/2002 | Sherman |
| 6,418,498 B1 | 7/2002 | Martwick |
| 6,466,499 B1 | 10/2002 | Blodgett |
| 6,510,098 B1 | 1/2003 | Taylor |
| 6,563,754 B1 | 5/2003 | Lien et al. |
| 6,578,058 B1 | 6/2003 | Nygaard |
| 6,731,542 B1 | 5/2004 | Le et al. |
| 6,754,746 B1 | 6/2004 | Leung et al. |
| 6,768,679 B1 | 7/2004 | Le et al. |
| 6,807,614 B2 | 10/2004 | Chung |
| 6,816,422 B2 | 11/2004 | Harnade et al. |
| 6,819,612 B1 | 11/2004 | Achter |
| 6,894,549 B2 | 5/2005 | Eliason |
| 6,900,845 B1 * | 5/2005 | Christopher ....... H04N 21/4621 348/445 |
| 6,943,579 B1 | 9/2005 | Hazanchuk et al. |
| 6,948,056 B1 | 9/2005 | Roth |
| 6,950,771 B1 | 9/2005 | Fan et al. |
| 6,950,898 B2 | 9/2005 | Merritt et al. |
| 6,956,770 B2 | 10/2005 | Khalid et al. |
| 6,961,272 B2 | 11/2005 | Schreck |
| 6,965,648 B1 | 11/2005 | Smith et al. |
| 6,985,394 B2 | 1/2006 | Kim |
| 6,987,693 B2 | 1/2006 | Cernea et al. |
| 7,020,017 B2 | 3/2006 | Chen et al. |
| 7,028,170 B2 | 4/2006 | Saulsbury |
| 7,045,834 B2 | 5/2006 | Tran et al. |
| 7,054,178 B1 | 5/2006 | Shiah et al. |
| 7,061,817 B2 | 6/2006 | Raad et al. |
| 7,079,407 B1 | 7/2006 | Dimitrelis |
| 7,173,857 B2 | 2/2007 | Kato et al. |
| 7,187,585 B2 | 3/2007 | Li et al. |
| 7,196,928 B2 | 3/2007 | Chen |
| 7,260,565 B2 | 8/2007 | Lee et al. |
| 7,260,672 B2 | 8/2007 | Garney |
| 7,372,715 B2 | 5/2008 | Han |
| 7,400,532 B2 | 7/2008 | Aritome |
| 7,406,494 B2 | 7/2008 | Magee |
| 7,447,720 B2 | 11/2008 | Beaumont |
| 7,454,451 B2 | 11/2008 | Beaumont |
| 7,457,181 B2 | 11/2008 | Lee et al. |
| 7,535,769 B2 | 5/2009 | Cernea |
| 7,546,438 B2 | 6/2009 | Chung |
| 7,562,198 B2 | 7/2009 | Noda et al. |
| 7,574,466 B2 | 8/2009 | Beaumont |
| 7,602,647 B2 | 10/2009 | Li et al. |
| 7,663,928 B2 | 2/2010 | Tsai et al. |
| 7,685,365 B2 | 3/2010 | Rajwar et al. |
| 7,692,466 B2 | 4/2010 | Ahmadi |
| 7,752,417 B2 | 7/2010 | Manczak et al. |
| 7,791,962 B2 | 9/2010 | Noda et al. |
| 7,796,453 B2 | 9/2010 | Riho et al. |
| 7,805,587 B1 | 9/2010 | Van Dyke et al. |
| 7,808,854 B2 | 10/2010 | Takase |

(56) References Cited

U.S. PATENT DOCUMENTS

| | | | |
|---|---|---|---|
| 7,827,372 B2 | 11/2010 | Bink et al. | |
| 7,869,273 B2 | 1/2011 | Lee et al. | |
| 7,898,864 B2 | 3/2011 | Dong | |
| 7,924,628 B2 | 4/2011 | Danon et al. | |
| 7,937,535 B2 | 5/2011 | Ozer et al. | |
| 7,957,206 B2 | 6/2011 | Bauser | |
| 7,979,667 B2 | 7/2011 | Allen et al. | |
| 7,996,749 B2 | 8/2011 | Ding et al. | |
| 8,042,082 B2 | 10/2011 | Solomon | |
| 8,045,391 B2 | 10/2011 | Mohklesi | |
| 8,059,438 B2 | 11/2011 | Chang et al. | |
| 8,095,825 B2 | 1/2012 | Hirotsu et al. | |
| 8,117,462 B2 | 2/2012 | Snapp et al. | |
| 8,164,942 B2 | 4/2012 | Gebara et al. | |
| 8,208,328 B2 | 6/2012 | Hong | |
| 8,213,248 B2 | 7/2012 | Moon et al. | |
| 8,223,568 B2 | 7/2012 | Seo | |
| 8,238,173 B2 | 8/2012 | Akerib et al. | |
| 8,274,841 B2 | 9/2012 | Shinano et al. | |
| 8,279,683 B2 | 10/2012 | Klein | |
| 8,310,884 B2 | 11/2012 | Iwai et al. | |
| 8,332,367 B2 | 12/2012 | Bhattacherjee et al. | |
| 8,339,824 B2 | 12/2012 | Cooke | |
| 8,339,883 B2 | 12/2012 | Yu et al. | |
| 8,347,154 B2 | 1/2013 | Bahali et al. | |
| 8,351,292 B2 | 1/2013 | Matano | |
| 8,356,144 B2 | 1/2013 | Hessel et al. | |
| 8,417,921 B2 | 4/2013 | Gonion et al. | |
| 8,462,532 B1 | 6/2013 | Argyres | |
| 8,484,276 B2 | 7/2013 | Carlson et al. | |
| 8,495,438 B2 | 7/2013 | Roine | |
| 8,503,250 B2 | 8/2013 | Demone | |
| 8,526,239 B2 | 9/2013 | Kim | |
| 8,533,245 B1 | 9/2013 | Cheung | |
| 8,539,145 B1* | 9/2013 | Warnes | G11C 8/12 |
| | | | 711/105 |
| 8,555,037 B2 | 10/2013 | Gonion | |
| 8,599,613 B2 | 12/2013 | Abiko et al. | |
| 8,605,015 B2 | 12/2013 | Guttag et al. | |
| 8,625,376 B2 | 1/2014 | Jung et al. | |
| 8,644,101 B2 | 2/2014 | Jun et al. | |
| 8,650,232 B2 | 2/2014 | Stortz et al. | |
| 8,873,272 B2 | 10/2014 | Lee | |
| 8,964,496 B2 | 2/2015 | Manning | |
| 8,971,124 B1 | 3/2015 | Manning | |
| 9,015,390 B2 | 4/2015 | Klein | |
| 9,047,193 B2 | 6/2015 | Lin et al. | |
| 9,128,634 B1* | 9/2015 | Kang | G06F 3/0679 |
| 9,165,023 B2 | 10/2015 | Moskovich et al. | |
| 9,778,858 B1* | 10/2017 | Prasad | G06F 3/0679 |
| 2001/0007112 A1 | 7/2001 | Porterfield | |
| 2001/0008492 A1 | 7/2001 | Higashiho | |
| 2001/0010057 A1 | 7/2001 | Yamada | |
| 2001/0028584 A1 | 10/2001 | Nakayama et al. | |
| 2001/0043089 A1 | 11/2001 | Forbes et al. | |
| 2002/0059355 A1 | 5/2002 | Peleg et al. | |
| 2003/0033477 A1* | 2/2003 | Johnson | G06F 3/0601 |
| | | | 711/114 |
| 2003/0167426 A1 | 9/2003 | Slobodnik | |
| 2003/0222879 A1 | 12/2003 | Lin et al. | |
| 2004/0073592 A1 | 4/2004 | Kim et al. | |
| 2004/0073773 A1 | 4/2004 | Demjanenko | |
| 2004/0085840 A1 | 5/2004 | Vali et al. | |
| 2004/0095826 A1 | 5/2004 | Perner | |
| 2004/0154002 A1 | 8/2004 | Ball et al. | |
| 2004/0205289 A1 | 10/2004 | Srinivasan | |
| 2004/0236920 A1 | 11/2004 | Sheaffer | |
| 2004/0240251 A1 | 12/2004 | Nozawa et al. | |
| 2005/0015557 A1 | 1/2005 | Wang et al. | |
| 2005/0078514 A1 | 4/2005 | Scheuerlein et al. | |
| 2005/0097417 A1 | 5/2005 | Agrawal et al. | |
| 2006/0047937 A1 | 3/2006 | Selvaggi et al. | |
| 2006/0069849 A1 | 3/2006 | Rudelic | |
| 2006/0146623 A1 | 7/2006 | Mizuno et al. | |
| 2006/0149804 A1 | 7/2006 | Luick et al. | |
| 2006/0181917 A1 | 8/2006 | Kang et al. | |
| 2006/0215432 A1 | 9/2006 | Wickeraad et al. | |
| 2006/0225072 A1 | 10/2006 | Lari et al. | |
| 2006/0291282 A1 | 12/2006 | Liu et al. | |
| 2007/0103986 A1 | 5/2007 | Chen | |
| 2007/0171747 A1 | 7/2007 | Hunter et al. | |
| 2007/0180006 A1 | 8/2007 | Gyoten et al. | |
| 2007/0180184 A1 | 8/2007 | Sakashita et al. | |
| 2007/0195602 A1 | 8/2007 | Fong et al. | |
| 2007/0285131 A1 | 12/2007 | Sohn | |
| 2007/0285979 A1 | 12/2007 | Turner | |
| 2007/0291532 A1 | 12/2007 | Tsuji | |
| 2008/0025073 A1 | 1/2008 | Arsovski | |
| 2008/0037333 A1 | 2/2008 | Kim et al. | |
| 2008/0052711 A1 | 2/2008 | Forin et al. | |
| 2008/0091888 A1* | 4/2008 | Sandy | G06F 13/4234 |
| | | | 711/154 |
| 2008/0137388 A1 | 6/2008 | Krishnan et al. | |
| 2008/0165601 A1 | 7/2008 | Matick et al. | |
| 2008/0178053 A1 | 7/2008 | Gorman et al. | |
| 2008/0215937 A1 | 9/2008 | Dreibelbis et al. | |
| 2009/0031078 A1* | 1/2009 | Warnes | G11C 29/44 |
| | | | 711/105 |
| 2009/0067218 A1 | 3/2009 | Graber | |
| 2009/0154238 A1 | 6/2009 | Lee | |
| 2009/0154273 A1 | 6/2009 | Borot et al. | |
| 2009/0254697 A1 | 10/2009 | Akerib | |
| 2010/0067296 A1 | 3/2010 | Li | |
| 2010/0091582 A1 | 4/2010 | Vali et al. | |
| 2010/0172190 A1 | 7/2010 | Lavi et al. | |
| 2010/0210076 A1 | 8/2010 | Gruber et al. | |
| 2010/0226183 A1 | 9/2010 | Kim | |
| 2010/0262767 A1* | 10/2010 | Borchers | G06F 12/0246 |
| | | | 711/103 |
| 2010/0308858 A1 | 12/2010 | Noda et al. | |
| 2010/0332895 A1 | 12/2010 | Billing et al. | |
| 2011/0051523 A1 | 3/2011 | Manabe et al. | |
| 2011/0063919 A1 | 3/2011 | Chandrasekhar et al. | |
| 2011/0093662 A1 | 4/2011 | Walker et al. | |
| 2011/0103151 A1 | 5/2011 | Kim et al. | |
| 2011/0119467 A1 | 5/2011 | Cadambi et al. | |
| 2011/0122695 A1 | 5/2011 | Li et al. | |
| 2011/0140741 A1 | 6/2011 | Zerbe et al. | |
| 2011/0219260 A1 | 9/2011 | Nobunaga et al. | |
| 2011/0267883 A1 | 11/2011 | Lee et al. | |
| 2011/0317496 A1 | 12/2011 | Bunce et al. | |
| 2012/0005397 A1 | 1/2012 | Lim et al. | |
| 2012/0017039 A1 | 1/2012 | Margetts | |
| 2012/0023281 A1 | 1/2012 | Kawasaki et al. | |
| 2012/0120705 A1 | 5/2012 | Mitsubori et al. | |
| 2012/0134216 A1 | 5/2012 | Singh | |
| 2012/0134225 A1 | 5/2012 | Chow | |
| 2012/0134226 A1 | 5/2012 | Chow | |
| 2012/0140540 A1 | 6/2012 | Agam et al. | |
| 2012/0182798 A1 | 7/2012 | Hosono et al. | |
| 2012/0195146 A1 | 8/2012 | Jun et al. | |
| 2012/0198310 A1 | 8/2012 | Tran et al. | |
| 2012/0210052 A1 | 8/2012 | Norman | |
| 2012/0246380 A1 | 9/2012 | Akerib et al. | |
| 2012/0265964 A1 | 10/2012 | Murata et al. | |
| 2012/0281486 A1 | 11/2012 | Rao et al. | |
| 2012/0303627 A1 | 11/2012 | Keeton et al. | |
| 2013/0003467 A1 | 1/2013 | Klein | |
| 2013/0061006 A1 | 3/2013 | Hein | |
| 2013/0107623 A1 | 5/2013 | Kavalipurapu et al. | |
| 2013/0117541 A1 | 5/2013 | Choquette et al. | |
| 2013/0124783 A1 | 5/2013 | Yoon et al. | |
| 2013/0132702 A1 | 5/2013 | Patel et al. | |
| 2013/0138646 A1 | 5/2013 | Sirer et al. | |
| 2013/0163362 A1 | 6/2013 | Kim | |
| 2013/0173888 A1 | 7/2013 | Hansen et al. | |
| 2013/0205114 A1 | 8/2013 | Badam et al. | |
| 2013/0219112 A1 | 8/2013 | Okin et al. | |
| 2013/0227361 A1 | 8/2013 | Bowers et al. | |
| 2013/0283122 A1 | 10/2013 | Anholt et al. | |
| 2013/0286705 A1 | 10/2013 | Grover et al. | |
| 2013/0326154 A1 | 12/2013 | Haswell | |
| 2013/0326160 A1* | 12/2013 | Sperber | G06F 9/345 |
| | | | 711/154 |

(56) References Cited

U.S. PATENT DOCUMENTS

| | | |
|---|---|---|
| 2013/0332707 A1 | 12/2013 | Gueron et al. |
| 2014/0082306 A1 | 3/2014 | Kajigaya |
| 2014/0176187 A1 | 6/2014 | Jayasena et al. |
| 2014/0185395 A1 | 7/2014 | Seo |
| 2014/0215185 A1 | 7/2014 | Danielsen |
| 2014/0250279 A1 | 9/2014 | Manning |
| 2014/0344934 A1 | 11/2014 | Jorgensen |
| 2015/0029798 A1 | 1/2015 | Manning |
| 2015/0074373 A1* | 3/2015 | Sperber .................. G06F 9/345 712/7 |
| 2015/0134713 A1 | 5/2015 | Wheeler |
| 2015/0324290 A1 | 11/2015 | Leidel |
| 2015/0325272 A1 | 11/2015 | Murphy |

FOREIGN PATENT DOCUMENTS

| | | |
|---|---|---|
| EP | 2026209 | 2/2009 |
| JP | H0831168 | 2/1996 |
| JP | 2009259193 | 3/2015 |
| KR | 10-0211482 | 8/1998 |
| KR | 10-2010-0134235 | 12/2010 |
| KR | 10-2013-0049421 | 5/2013 |
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |

OTHER PUBLICATIONS

Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.

Kogge, et al., "Processing in Memory: Chips to Petaflops," May 23, 1997, (8 pgs.), retrieved from: http://www.cs.ucf.edu/courses/cda5106/summer02/papers/kogge97PIM.pdf.

Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.

Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.

U.S. Appl. No. 13/449,082, entitled, "Methods and Apparatus for Pattern Matching," filed Apr. 17, 2012, (37 pgs.).

U.S. Appl. No. 13/743,686, entitled, "Weighted Search and Compare in a Memory Device," filed Jan. 17, 2013, (25 pgs.).

U.S. Appl. No. 13/774,636, entitled, "Memory as a Programmable Logic Device," filed Feb. 22, 2013, (30 pgs.).

U.S. Appl. No. 13/774,553, entitled, "Neural Network in a Memory Device," filed Feb. 22, 2013, (63 pgs.).

U.S. Appl. No. 13/796,189, entitled, "Performing Complex Arithmetic Functions in a Memory Device," filed Mar. 12, 2013, (23 pgs.).

International Search Report and Written Opinion for PCT Application No. PCT/US2013/043702, dated Sep. 26, 2013, (11 pgs.).

Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.

Pagiamtzis, Kostas, "Content-Addressable Memory Introduction", Jun. 25, 2007, (6 pgs.), retrieved from: http://www.pagiamtzis.com/cam/camintro.

Debnath, Biplob, Bloomflash: Bloom Filter on Flash-Based Storage, 2011 31st Annual Conference on Distributed Computing Systems, Jun. 20-24, 2011, 10 pgs.

Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.

"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.

Stojmenovic, "Multiplicative Circulant Networks Topological Properties and Communication Algorithms", (25 pgs.), Discrete Applied Mathematics 77 (1997) 281-305.

Boyd et al., "On the General Applicability of Instruction-Set Randomization", Jul.-Sep. 2010, (14 pgs.), vol. 7, Issue 3, IEEE Transactions on Dependable and Secure Computing.

Elliot, et al., "Computational RAM: Implementing Processors in Memory", Jan.-Mar. 1999, (10 pgs.), vol. 16, Issue 1, IEEE Design and Test of Computers Magazine.

International Search Report and Written Opinion for related PCT Application No. PCT/US2016/015027, dated May 31, 2016, 13 pages.

* cited by examiner

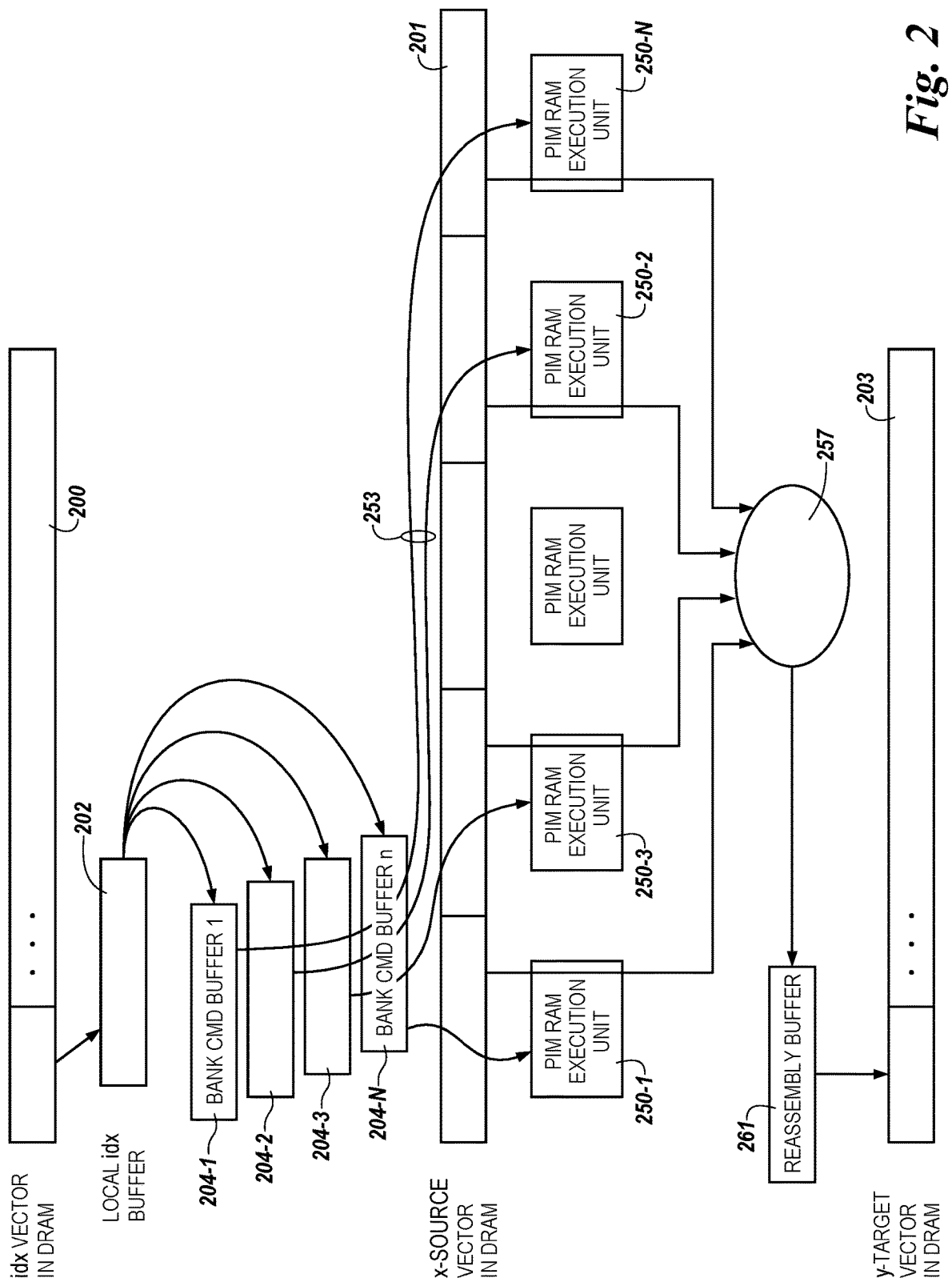

9-1

| | 944 | 945 | 956 | 970 | 971 |
|---|---|---|---|---|---|
| | A | B | NOT OPEN | OPEN TRUE | OPEN INVERT |
| | 0 | 0 | 0 | 0 | 1 |
| | 0 | 1 | 0 | 1 | 0 |
| 975 → ╳╳╳ | | | | | |
| | 1 | 0 | 1 | 0 | 1 |
| | 1 | 1 | 1 | 1 | 0 |

9-2

| | | | | | | | | | | |
|---|---|---|---|---|---|---|---|---|---|---|
| | FF | 0 | 0 | 0 | 0 | 0 | 0 | 1 | 1 | 1 | ← 976 |
| | FT | 0 | 0 | 0 | 1 | 1 | 1 | 0 | 0 | 0 | ← 977 |
| | TF | 0 | 0 | 1 | 0 | 0 | 1 | 0 | 0 | 1 | ← 978 |
| | TT | 0 | 1 | 0 | 0 | 1 | 0 | 0 | 1 | 0 | ← 979 |
| A | B | A | A*B | A*B̄ | A+B | B | AXB | A+B̄ | $\overline{AXB}$ | B̄ | ← 947 |
| 0 | 0 | 0 | 0 | 0 | 0 | 0 | 0 | 1 | 1 | 1 |
| 0 | 1 | 0 | 0 | 0 | 1 | 1 | 1 | 0 | 0 | 0 |
| 1 | 0 | 1 | 0 | 1 | 1 | 0 | 1 | 1 | 0 | 1 |
| 1 | 1 | 1 | 1 | 0 | 1 | 1 | 0 | 1 | 1 | 0 |

APPARATUSES AND METHODS FOR SCATTER AND GATHER

PRIORITY INFORMATION

This application is a Continuation of U.S. application Ser. No. 15/669,300, filed Aug. 4, 2017, which is a Continuation of International Application Number PCT/US2016/015027, filed Jan. 27, 2016, which claims the benefit to U.S. Provisional Application 62/112,843, filed Feb. 6, 2015, the entire contents of which are incorporated herein by reference in its entirety.

TECHNICAL FIELD

The present disclosure relates generally to semiconductor memory and methods, and more particularly, to apparatuses and methods related to implementing scatter and gather operations in a memory array.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can comprise a number of functional units such as arithmetic logic unit (ALU) circuitry, floating point unit (FPU) circuitry, and/or a combinatorial logic block, for example, which can be used to execute instructions by performing logical operations such as AND, OR, NOT, NAND, NOR, and XOR, and invert (e.g., inversion) logical operations on data (e.g., one or more operands). For example, functional unit circuitry may be used to perform arithmetic operations such as addition, subtraction, multiplication, and/or division on operands via a number of logical operations.

A number of components in an electronic system may be involved in providing instructions to the functional unit circuitry for execution. The instructions may be generated, for instance, by a processing resource such as a controller and/or host processor. Data (e.g., the operands on which the instructions will be executed) may be stored in a memory array that is accessible by the functional unit circuitry. The instructions and/or data may be retrieved from the memory array and sequenced and/or buffered before the functional unit circuitry begins to execute instructions on the data. Furthermore, as different types of operations may be executed in one or multiple clock cycles through the functional unit circuitry, intermediate results of the instructions and/or data may also be sequenced and/or buffered.

In many instances, the processing resources (e.g., processor and/or associated functional unit circuitry may be external to the memory array, and data is accessed via a bus between the processing resources and the memory array to execute a set of instructions. Processing performance may be improved in a processor-in-memory device, in which a processor may be implemented internal and/or near to a memory (e.g., directly on a same chip as the memory array). A processing-in-memory device may save time by reducing and/or eliminating external communications and may also conserve power.

BRIEF DESCRIPTION OF THE DRAWINGS

FIG. 2 illustrates a block diagram of an apparatus for gather and/or scatter in a memory device in accordance with a number of embodiments of the present disclosure.

FIG. 9 is a logic table illustrating selectable logic operation results implemented by a sensing circuitry shown in FIG. 8 in accordance with a number of embodiments of the present disclosure.

DETAILED DESCRIPTION

Figure 1A:
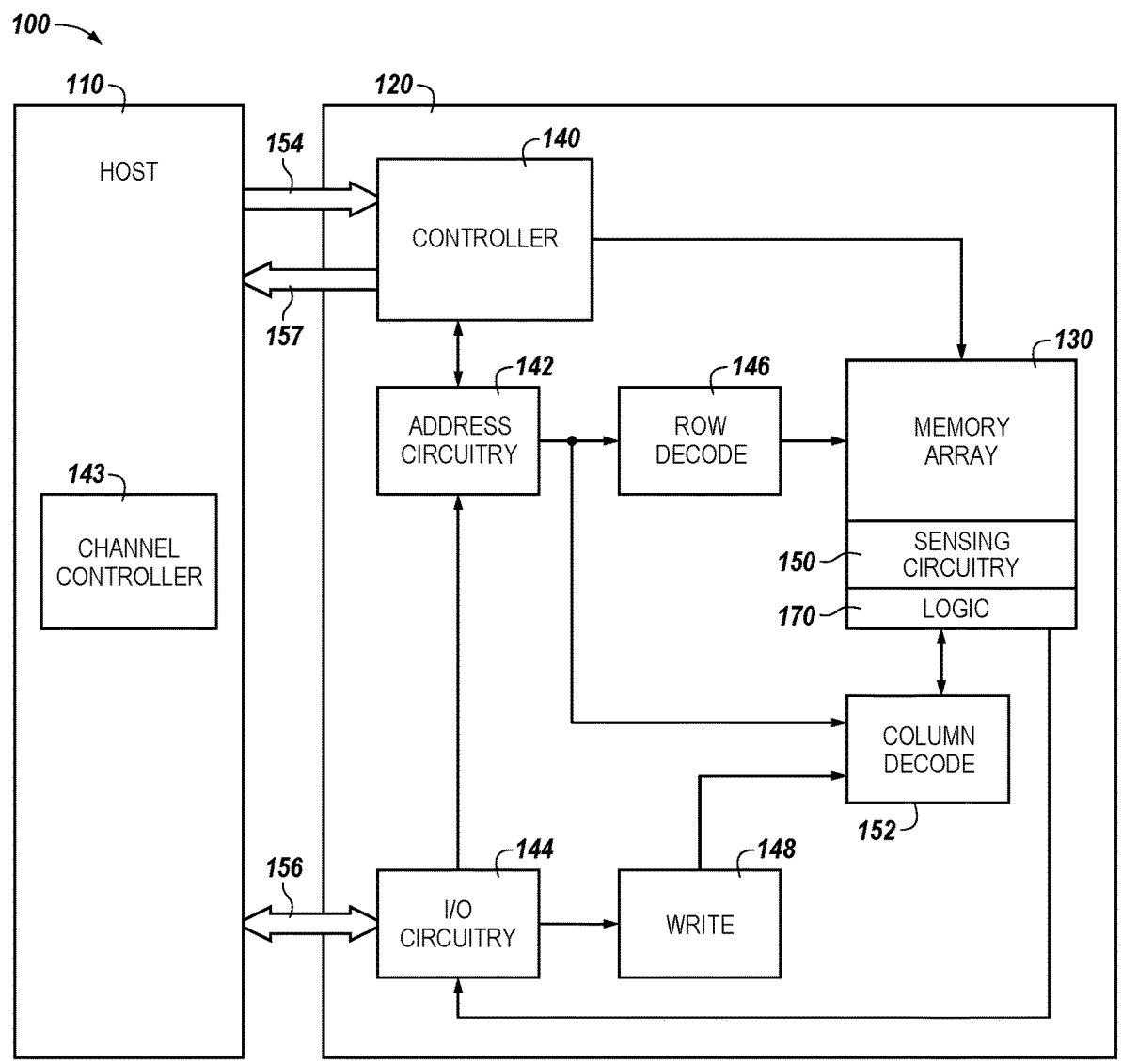
FIG. 1A is a block diagram of an apparatus in the form of an electronic system including a memory device in accordance with a number of embodiments of the present disclosure.

The present disclosure includes apparatuses and methods related to scatter/gather in a memory array. In one embodiment, the apparatus comprises a memory device coupled to a host via a data bus and a control bus. The memory device includes an array of memory cells and sensing circuitry coupled to the array via a plurality of sense lines. The sensing circuitry includes sense amplifiers and a compute component configured to implement logical operations.

A memory controller is coupled to the array and sensing circuitry. The memory controller is configured to receive a block of instructions, including a gather and/or scatter operation from a channel controller associated with the host and memory device. The memory controller is further configured to subdivide the block of instructions so that operations before, between and after a local gather operation can be executed locally on the memory device.

Scatter and/or gather (hereinafter "scatter/gather"), also known as vectored Input/Output (I/O), is a technique used in applications accessing large data sets. When applied to large data sets, memory array access patterns generated by scatter/gather operations can often show very low ordering and locality of successive accesses. Data accesses can be dispersed all over the memory array, which can be inefficient. Embodiments of the present disclosure provide an apparatus and methods for implementing an efficient scatter/gather technique involving a memory device having processing-in-memory (PIM) capabilities.

Scatter can be generally expressed as:

for (i=0;i<N;i++)

y[idx[i]]=x[i]

and gather can be generally expressed as:

for (i=0;i<N;i++)

x[i]=y[idx[i]]

where i is an index (e.g., counter, pointer) and N represents a number of indices used to store a quantity of data in a memory array. The expression idx[i] represents an index vector comprised of indices. As such, the requested data, x[i], is a function (y) of the index vector. In this manner, the index vector contains information by which pieces of the requested data are stored/found in the memory array.

For small-sized index vectors, the operations to extract and process the indices do not pose a significant challenge for modem computing system and memory device. However, when the aggregate size of the index vectors become larger than the caching ability of the computing system, performance of the scatter/gather operations decreases significantly due to data being fetched into cache, used a small number of times (e.g., once) and thereafter flushed out of cache having to be re-read into cache again later. However where large quantities of data are being requested, this inefficiency is more than just an inadequate cache size. Giga Updates Per Second (GUPS) is an example of one recognized benchmark to measure performance of a computing system and memory device for scatter/gather operations.

The index vector (e.g., idx[i]) can be thought of as being "pathological" in that the pattern of data elements comprising the requested data, and to which a pattern of index vector elements corresponds, can impact the efficiency and performance of scatter/gather operations. Previous approaches to scatter/gather operations utilized simple "tricks" to optimize the overall scatter/gather operation. However, as the amount of data being requested increases, the quantity of possible patterns in the index vector can also increase. The index vector can take on many index patterns that can confound some simple tricks previously utilized to optimize scatter/gather operations. In order to appreciate the improved scatter/gather techniques and apparatus for implementing such techniques, a discussion of a memory device having PIM capabilities, and associated host, follows.

According to various embodiments, performance of scatter/gather operations involving a memory device having PIM capabilities can distribute implementation of a scatter/gather operation over multiple sensing circuitries that can implement logical operations within the memory array. Scatter/gather operations involving a memory device having PIM capabilities can be completed in less time and using less power. Some time and power advantage can be realized by reducing the amount of data that is moved around a computing system to process the requested memory array operations (e.g., reads, writes, etc.).

A number of embodiments of the present disclosure can provide improved parallelism and/or reduced power consumption in association with performing compute functions as compared to previous systems such as previous PIM systems and systems having an external processor (e.g., a processing resource located external from a memory array, such as on a separate integrated circuit chip). For instance, a number of embodiments can provide for performing fully complete compute functions such as integer add, subtract, multiply, divide, and CAM (content addressable memory) functions without transferring data out of the memory array and sensing circuitry via a bus (e.g., data bus, address bus, control bus), for instance. Such compute functions can involve performing a number of logical operations (e.g., logical functions such as AND, OR, NOT, NOR, NAND, XOR, etc.). However, embodiments are not limited to these examples. For instance, performing logical operations can include performing a number of non-Boolean logic operations such as copy, compare, destroy, etc.

In previous approaches, data may be transferred from the array and sensing circuitry (e.g., via a bus comprising input/output (I/O) lines) to a processing resource such as a processor, microprocessor, and/or compute engine, which may comprise ALU circuitry and/or other functional unit circuitry configured to perform the appropriate logical operations. However, transferring data from a memory array and sensing circuitry to such processing resource(s) can involve significant power consumption. Even if the processing resource is located on a same chip as the memory array, significant power can be consumed in moving data out of the array to the compute circuitry, which can involve performing a sense line (which may be referred to herein as a digit line or data line) address access (e.g., firing of a column decode signal) in order to transfer data from sense lines onto I/O lines (e.g., local I/O lines), moving the data to the array periphery, and providing the data to the compute function.

Furthermore, the circuitry of the processing resource(s) (e.g., compute engine) may not conform to pitch rules associated with a memory array. For example, the cells of a memory array may have a $4F^2$ or $6F^2$ cell size, where "F" is a feature size corresponding to the cells. As such, the devices (e.g., logic gates) associated with ALU circuitry of previous PIM systems may not be capable of being formed on pitch with the memory cells, which can affect chip size and/or memory density, for example. A number of embodiments of the present disclosure include sensing circuitry formed on pitch with an array of memory cells and capable of performing compute functions such as gather and scatter operations local to the array of memory cells.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, designators such as "N", "M", etc., particularly with respect to reference numerals in the drawings, indicate that a number of the particular feature so designated can be included. As used herein, "a number of" a particular thing can refer to one or more of such things (e.g., a number of memory arrays can refer to one or more memory arrays). A "plurality of" is intended to refer to more than one of such things.

The figures herein follow a numbering convention in which the first digit or digits correspond to the drawing figure number and the remaining digits identify an element or component in the drawing. Similar elements or components between different figures may be identified by the use of similar digits. For example, 206 may reference element "06" in FIG. 2, and a similar element may be referenced as 606 in FIG. 6. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

Figure 1B:
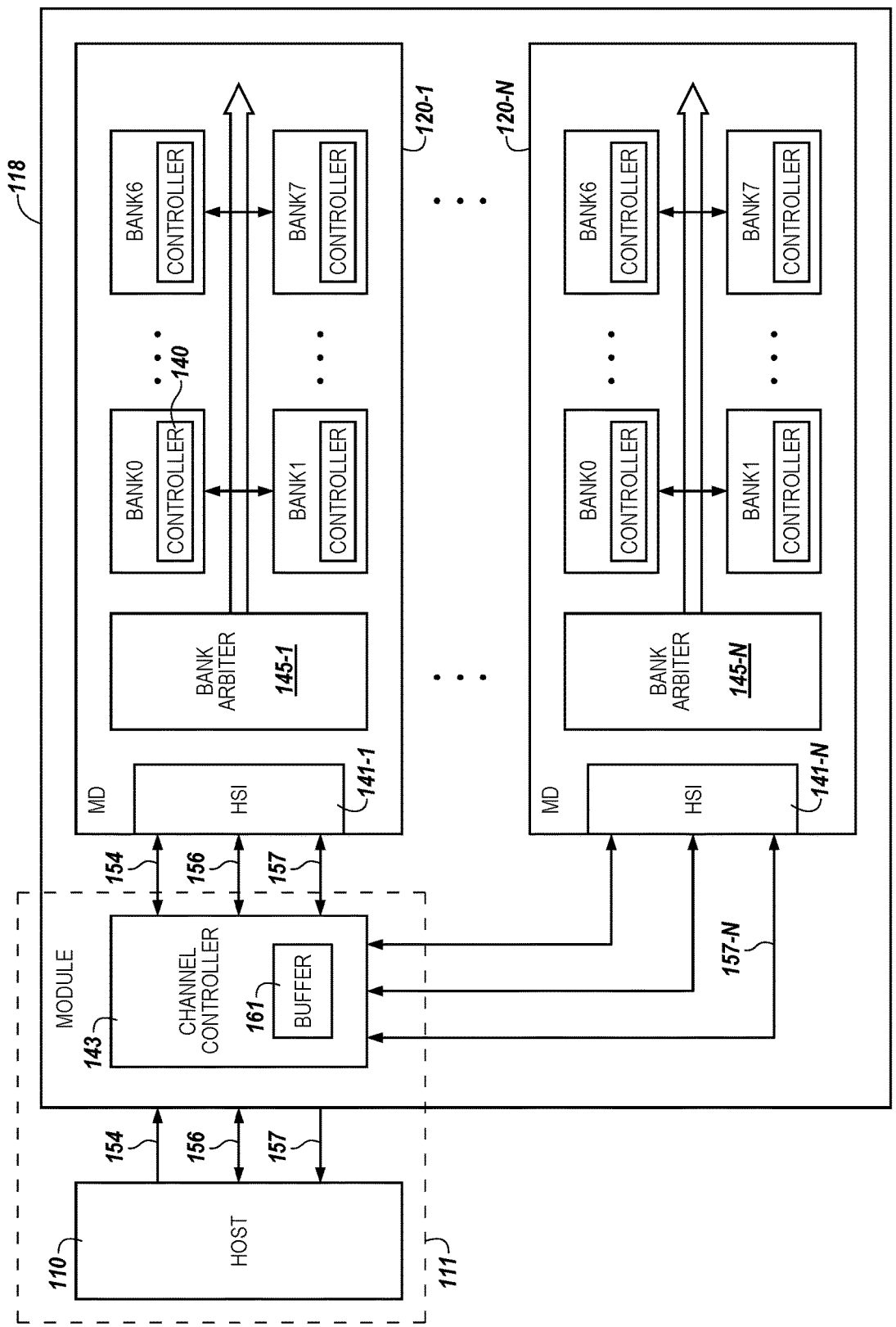
FIG. 1B is another block diagram of an apparatus in the form of an electronic system including a memory device in accordance with a number of embodiments of the present disclosure.

FIG. 1A is a block diagram of an apparatus in the form of a computing system 100 including a memory device 120 in accordance with a number of embodiments of the present disclosure. As used herein, a memory device 120, memory controller 140, channel controller 143, bank arbiter 145, high speed interface (HSI) 141, memory array 130, sensing circuitry 150, and/or additional logic circuitry 170, as shown in FIGS. 1A and 1B, might also be separately considered an "apparatus."

System 100 includes a host 110 coupled (e.g., connected) to memory device 120, which includes a memory array 130. Host 110 can be a host system such as a personal laptop computer, a desktop computer, a digital camera, a smart phone, or a memory card reader, among various other types of hosts. Host 110 can include a system motherboard and/or backplane and can include a number of processing resources (e.g., one or more processors, microprocessors, or some other type of controlling circuitry). The system 100 can include separate integrated circuits or both the host 110 and the memory device 120 can be on the same integrated circuit. The system 100 can be, for instance, a server system and/or a high performance computing (HPC) system and/or a portion thereof. Although the example shown in FIGS. 1A and 1B illustrates a system having a Von Neumann architecture, embodiments of the present disclosure can be implemented in non-Von Neumann architectures, which may not include one or more components (e.g., CPU, ALU, etc.) often associated with a Von Neumann architecture.

For clarity, the system 100 has been simplified to focus on features with particular relevance to the present disclosure. The memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines (which may be referred to herein as word lines or select lines) and columns coupled by sense lines, which may be referred to herein as data lines or digit lines. Although a single array 130 is shown in FIG. 1, embodiments are not so limited. For instance, memory device 120 may include a number of arrays 130 (e.g., a number of banks of DRAM cells, NAND flash cells, etc.).

The memory device 120 includes address circuitry 142 to latch address signals provided over a data bus 156 (e.g., an I/O bus) through I/O circuitry 144. Status, exception, and other data information can be provided from the memory controller 140 on the memory device 120 to a channel controller 143 via a high speed interface (HSI) (both shown in FIG. 1B), including an out-of-band bus 157 (shown in FIG. 1B), which in turn can be provided from the memory device 120 to the host 110. Address signals are received through address circuitry 142 and decoded by a row decoder 146 and a column decoder 152 to access the memory array 130. Data can be read from memory array 130 by sensing voltage and/or current changes on the data lines using sensing circuitry 150. The sensing circuitry 150 can read and latch a page (e.g., row) of data from the memory array 130. The I/O circuitry 144 can be used for bi-directional data communication with host 110 over the data bus 156. The write circuitry 148 is used to write data to the memory array 130.

Memory controller 140, e.g., bank control logic and/or sequencer, decodes signals provided by a control bus 154 from the host 110. These signals can include chip enable signals, write enable signals, and address latch signals that are used to control operations performed on the memory array 130, including data read, data write, and data erase operations. In various embodiments, the memory controller 140 is responsible for executing instructions from the host 110. The memory controller 140 can be a state machine, a sequencer, or some other type of controller. The controller 140 can control shifting data (e.g., right or left) in an array, e.g., memory array 130.

Examples of the sensing circuitry 150 are described further below. For instance, in a number of embodiments, the sensing circuitry 150 can comprise a number of sense amplifiers and a number of compute components, which may serve as, and be referred to herein as, an accumulator and can be used to perform logical operations (e.g., on data associated with complementary data lines).

In a number of embodiments, the sensing circuitry 150 can be used to perform logical operations using data stored in array 130 as inputs and store the results of the logical operations back to the array 130 without transferring data via a sense line address access (e.g., without firing a column decode signal). As such, various compute functions can be performed using, and within, sensing circuitry 150 rather than (or in association with) being performed by processing resources external to the sensing circuitry (e.g., by a processor associated with host 110 and/or other processing circuitry, such as ALU circuitry, located on device 120 (e.g., on controller 140 or elsewhere)).

In various previous approaches, data associated with an operand, for instance, would be read from memory via sensing circuitry and provided to external ALU circuitry via I/O lines (e.g., via local I/O lines and/or global I/O lines). The external ALU circuitry could include a number of registers and would perform compute functions using the operands, and the result would be transferred back to the array via the I/O lines. In contrast, in a number of embodiments of the present disclosure, sensing circuitry 150 is configured to perform logical operations on data stored in memory array 130 and store the result back to the memory array 130 without enabling an I/O line (e.g., a local I/O line) coupled to the sensing circuitry 150. The sensing circuitry 150 can be formed on pitch with the memory cells of the array. Additional peripheral sense amplifier and/or logic 170 can be coupled to the sensing circuitry 150.

As such, in a number of embodiments, circuitry external to array 130 and sensing circuitry 150 is not needed to perform compute functions as the sensing circuitry 150 can perform the appropriate logical operations to perform such compute functions without the use of an external processing resource. Therefore, the sensing circuitry 150 may be used to compliment and/or to replace, at least to some extent, such an external processing resource (or at least the bandwidth consumption of such an external processing resource).

However, in a number of embodiments, the sensing circuitry 150 may be used to perform logical operations (e.g., to execute instructions) in addition to logical operations performed by an external processing resource (e.g., host 110). For instance, host 110 and/or sensing circuitry 150 may be limited to performing only certain logical operations and/or a certain number of logical operations.

Enabling an I/O line can include enabling (e.g., turning on) a transistor having a gate coupled to a decode signal (e.g., a column decode signal) and a source/drain coupled to the I/O line. However, embodiments are not limited to not enabling an I/O line. For instance, in a number of embodiments, the sensing circuitry (e.g., 150) can be used to perform logical operations without enabling column decode lines of the array; however, the local I/O line(s) may be enabled in order to transfer a result to a suitable location other than back to the array 130 (e.g., to an external register).

FIG. 1B is a block diagram of another apparatus architecture in the form of a computing system 100 including a plurality of memory devices 120-1, . . . , 120-N coupled to a host 110 via a channel controller 143 in accordance with a number of embodiments of the present disclosure. In at least one embodiment the channel controller 143 may be coupled to the plurality of memory devices 120-1, . . . , 120-N in an integrated manner in the form of a module 118. In an alternative embodiment, the channel controller 143 may be integrated with the host 110, as illustrated by dashed lines 111. The channel controller 143 can be coupled to each of the plurality of memory devices 120-1, . . . , 120-N via a control bus 154 as described in FIG. 1A which in turn can be coupled to the host 110. The channel controller 143 can also be coupled to each of the plurality of memory devices, 120-1, . . . , 120-N via a data bus 156 as described in FIG. 1A which in turn can be coupled to the host 110. In addition, the channel controller 143 can be coupled to each of the plurality of memory devices 120-1, . . . , 120-N via an out-of-band (OOB) bus 157 associated with a high speed interface (HSI) 141, described more in connection with FIGS. 3-6, that is configured to report status, exception and other data information to the channel controller 143 to exchange with the host 110.

As shown in FIG. 1B, the channel controller 143 can receive the status and exception information from a high speed interface (HSI) (also referred to herein as a status channel interface) 141 associated with a bank arbiter 145 in each of the plurality of memory devices 120-1, . . . , 120-N. In the example of FIG. 1B, each of the plurality of memory devices 120-1, . . . , 120-N can include a bank arbiter 145 to sequence control and data with a plurality of banks, e.g., Bank zero (0), Bank one (1), . . . , Bank six (6), Bank seven (7), etc. Each of the plurality of banks, Bank 0, . . . , Bank 7, can include a memory controller 140 and other components, including an array of memory cells 130 and sensing circuitry 150, peripheral logic 170, etc., as described in connection with FIG. 1A.

For example, each of the plurality of banks, e.g., Bank 0, . . . , Bank 7, in the plurality of memory devices 120-1, . . . , 120-N can include address circuitry 142 to latch address signals provided over a data bus 156 (e.g., an I/O bus) through I/O circuitry 144. Status and/or exception information can be provided from the memory controller 140 on the memory device 120 to the channel controller 143, using the OOB bus 157, which in turn can be provided from the plurality of memory devices 120-1, . . . , 120-N to the host 110. For each of the plurality of banks, e.g., Bank 0, . . . , Bank 7, address signals can be received through address circuitry 142 and decoded by a row decoder 146 and a column decoder 152 to access the memory array 130. Data can be read from memory array 130 by sensing voltage and/or current changes on the data lines using sensing circuitry 150. The sensing circuitry 150 can read and latch a page (e.g., row) of data from the memory array 130. The I/O circuitry 144 can be used for bi-directional data communication with host 110 over the data bus 156. The write circuitry 148 is used to write data to the memory array 130 and the OOB bus 157 can be used to report status and exception information to the channel controller 143.

As described next in connection with FIG. 2, the channel controller 143 can include one or more local buffers 161 to store an index vector and bin (e.g., separately store) bank commands and indices for the various banks associated with each of the plurality of memory devices 120-1, . . . , 120-N in connection with a gather and/or scatter operation. The channel controller 143 can send commands to the plurality of memory devices 120-1, . . . , 120-N and field return results/data from such operations. As described herein, the return results/data can be returned to the channel controller 143 via the OOB bus 157 associated with the status channel interface on each of the plurality of memory devices 120-1, . . . , 120-N.

For clarity, the system 100 has been simplified to focus on features with particular relevance to the present disclosure. The memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines (which may be referred to herein as word lines or select lines) and columns coupled by sense lines, which may be referred to herein as data lines or digit lines. Although a single array 130 is shown in FIG. 1, embodiments are not so limited. For instance, memory device 120 may include a number of arrays 130 (e.g., a number of banks of DRAM cells, NAND flash cells, etc.).

As in FIG. 1A, a memory controller 140, e.g., bank control logic and/or sequencer, associated with any particular bank, Bank 0, . . . , Bank 7, in a given memory device, 120-1, . . . , 120-N, can decode signals provided by control bus 154 from the host 110. These signals can include chip enable signals, write enable signals, and address latch signals that are used to control operations performed on the memory array 130, including data read, data write, and data erase operations. In various embodiments, the memory controller 140 is responsible for executing instructions from the host 110. And, as above, the memory controller 140 can be a state machine, a sequencer, or some other type of controller. That is, the controller 140 can control shifting data (e.g., right or left) in an array, e.g., memory array 130.

FIG. 2 illustrates a block diagram example of an operations flow for a gather and/or scatter operation in an apparatus in accordance with a number of embodiments of the present disclosure. According to various embodiments, scatter operations and gather operations can be similar. Reference may be made to the channel controller 143, bank arbiter 145 coupled to a plurality of memory devices 120-1, . . . , 120-N and high speed interface 141 (example embodiments shown in more detail in FIGS. 3-6) of FIG. 1B together with the memory controller 140, array of memory cells 130 and sensing circuitry 150, including sense amplifiers and a compute component to implement logical functions, as shown in FIG. 1A (sensing circuitry shown in more detail in FIGS. 7 and 8). The following provides a detailed description of a gather operation, with aspects of a scatter operation that are unique from the described gather operation being discussed after the discussion of the gather operation.

A host 110 including an integrated (in 111 dashed line form) channel controller 143 (e.g., scaler processor), or alternatively a channel controller 143 integrated in module form, can send a block of instructions that include individual instructions (e.g., commands) for at least one of a gather operation and a scatter operation to a plurality of memory devices 120-1, . . . , 120-N (shown in FIG. 1B). For example, a read request can involve one or more gather operations. The host can provide the block of instructions to the memory device as a block within an index (idx) vector 200. The index vector 200 can be stored in an array of memory cells 130 in one or more of a plurality of banks of memory cells, e.g., Bank 0, . . . , Bank 7, in one or more memory devices, 120-1, . . . , 120-N. As described above, the array of memory cells 130 can be an array of dynamic random access memory (DRAM) cells. A memory controller, e.g., memory controller 140 to each bank in a plurality of banks, on a given memory device, 120-1, . . . , 120-N, can process the instructions in various ways, including changing an index vector used at the programming level into information that can be used by the given memory device. A bank arbiter 145 to each memory device (e.g., memory chip) can control and pass command instructions to the memory controllers 140 in the plurality of banks and aggregate status information from the banks to report back to the channel controller 143. The index vector can contain data as well location information associated with the data. The location information can be, for example, a series of indices (e.g., "vector" references). The indices can define location within a particular memory device structure, such as bank(s), subarray(s), row(s), and/or column(s).

In one embodiment, the channel controller 143 can extract an individual instruction comprising indices (e.g., individual vectors) from the index vector 200, and load the indices to a local idx buffer 202. The buffer 161 of the channel controller 143 shown in FIG. 1B, for example, may include the local idx buffer 202. Buffer 161 of the channel controller 143 in FIG. 1B may also include the independent device and bank command buffers, e.g., 204-1, 204-2, . . . , 204-N and the reassembly buffer 261 discussed in more detail below.

Typically, instructions executed in the memory device (e.g., memory chips), or portion of the memory device (e.g., bank), can be limited in scope to data contained in the memory device or portion of the memory device. Since it cannot be certain that a gather operation is confined to data solely within a particular portion of the memory device 120 (e.g., bank), a bank arbiter can orchestrate the gather operation among a plurality of memory controllers 140 associated with a plurality of memory portions (e.g., banks). As shown in FIG. 2, the channel controller 143 can store, e.g., "bin", indices from the idx vector according to memory device 120 structure and create independent device and bank command buffers, e.g., 204-1, 204-2, . . . , 204-N, to store individual instructions among the block of instructions to fetch and return data on an OOB bus 157 associate a high speed interface 141 to each memory device 120. The channel controller 143 can send the individual instruction (e.g., commands) to the memory device to fetch source data, e.g., x-source vector 201 in an array or memory cells in one or more banks in one or more memory devices.

The memory controller 140 to a given bank can de-reference locations of indices (e.g., individual vectors) in the block of instructions. The memory controller 140 is configured such that individual instructions in the received block of instructions can be subdivided and sent to a memory controller 140 such that operations before, between, and after local gather and/or scatter operations can be executed locally in a particular portion of a given memory device 120. The individual instructions subdivided out of the block of instructions can be referred to herein as a local instruction set.

The memory controller 140 can manage execution of the local instruction set on the associated portion of the memory device (e.g., bank). Execution can be performed by the sensing circuitry 150, e.g., PIM RAM execution units 250-1, . . . , 250-N in respective banks, performing logical operations and/or functions as the same is described herein. The memory controller 140 can monitor the local instruction set for completion in order to perform the gather operation at an appropriate time to ensure local, in-order execution. In this way, the memory controller 140 can manage an appropriate result for a particular data request, e.g., x-source vector in DRAM 201. Further, the memory controller can ensure that all other operations of a portion of the memory device are complete before starting a gather operation.

According to various embodiments, the memory controller 140 manages the gather operation to obtain portions of requested data, e.g., x-source vector in DRAM 201, from different portions of the memory device and/or different portions within a bank, e.g., subarray. As the reader will appreciate, the bank arbiter 145 can manage the gather operation from among each memory controller 140 to obtain portions of requested data from among the plurality of banks, e.g., Bank 0, . . . , Bank 7, of the memory device 120. The channel controller 143 can iterate through the indices of the index vector to "stream" 257 a collection of data from the portions of the memory device 120 comprising the requested data, e.g., using the bank arbiter 145, high speed interface 141 and the out-of-band (OOB) bus 157 to field the requested data to the channel controller 143 and/or return the requested data to the host 110. For example, the channel controller 143 can allocate buffers 161, shown as individual bank command buffers (BANK CMD BUFFER) 204-1, 204-2, . . . , 204-N in FIG. 2, to hold particular indices, which are portions of the index vector 200. The buffer 161, individual bank command buffers 204-1, 204-2, . . . , 204-N, can be local to the channel controller 143 and/or integrated buffers at respective portions of the memory device 120. The channel controller 143 may additionally allocate local buffers 161 to hold intermediate results from the x-source vector 201 reads, and can allocate a reassembly buffer 261 to hold the merged results for the requested data, e.g., y-target vector in DRAM 203.

As the channel controller 143 encounters a gather operation in a block of memory device instructions requested by the host 110, the channel controller 143 can implement the gather operation by reading a local index (idx) buffer 202 block by block (e.g., index register storing the idx vector 200). Each memory controller 140 associated with banks of the memory device 120 can locally store a moderately-sized buffer of relevant data corresponding to a portion of the index vector 200 distributed by the bank arbiter 145 to that particular bank. For example, each memory controller 140 may include a storage area as a buffer and may include a register. The memory controller 140 obtains the portion of requested data, e.g., the x-source vector portion, pointed to by an individual index, relevant to that bank. The memory controller 140 can group requests for portions of the requested data together by location, e.g., subarray, such that the portion of the memory device, e.g., bank, can execute instructions in an efficient manner to gather the necessary data and return it 257 to the channel controller 143 via the OOB bus 157 (also referred to as channel).

According to various embodiments, a portion of the requested data associated with a particular portion of the memory device 120, e.g., bank, is returned to the channel controller 143 via the out-of-band (OOB) bus 157 to avoid resource contention with further reads of the index vector 200. The OOB bus 157 can also be used to avoid resource contention with further writing of data to the y-target vector 203.

According to some embodiments, as data is returned to the channel controller via the OOB bus 157, each portion of the requested data can be tagged 261 as to its intended destination within the requested data, e.g., within the y-target vector 203. The channel controller 143 can assemble the portions of data obtained from various locations into a coherent writes to burst into target locations, e.g., y-target vector in DRAM 203.

Using the OOB channel to retrieve portions of the requested data avoids use of the data bus 156 shown in FIGS. 1A and 1B. In this manner, the "irregular" pattern of reads is not performed directly over the data bus 156, but rather is offloaded to the individual memory devices 120-1, ..., 120-N. The memory devices 120-1, ..., 120-N can use much less time and energy gathering only the specific data of the channel controller 143, whereas alternatively the channel controller 143 and/or host 110 would be wasting much of the data read over the normal data bursts, e.g., a normal DRAM data burst, if the channel controller 143 and/or host 110 were reading the gather operation information directly over the data bus 156. For example, time and energy will not be used, interrupting data reads over the normal data bursts, to also accommodate reading the data gather operation information over the data bus 156. Thus, according to various embodiments, sensing circuitry 150 gathers portions of the requested information, and each memory controller 140 communicates this information to the channel controller 143 over the OOB bus 157.

A scatter operation differs from a gather operation in that the portions of the memory device 120, e.g., sensing circuitry 150, operate to store portions of the requested data into the y-target vector 203, e.g., the host requests each memory device 120 to store the requested data into the y-target vector in DRAM. In the scatter operation, the channel controller 143 will be reading locations to be written to from the idx vector 200 and the data to be written from the x-source vector 201. The channel controller 143 will then group write requests by locality, e.g., bin indices according to PIM RAM structures (e.g., individual PIM RAM execution units (memory controllers 140)) and create individual instructions, stored in local command bank buffers 204-1, ..., 204-N, to send those individual instructions to appropriate memory controllers 140 in respective memory devices 120-1, ..., 120-N. The channel controller 143 will provide a stream of instructions to be executed by the sensing circuity 150 of the respective portions of the memory device 120-1, ..., 120-N that contains embedded data and specific locations such that each memory device 120 can execute these local write requests independent of the host 110 and/or channel controller 143, e.g., can be executed "offline". As used herein, "offline" refers to operations implemented by the sensing circuitries 150 of the respective portions of memory devices 120-1, ..., 120-N rather than by a data read and/or write involving the data bus 156. With respect to scatter operations, the OOB bus 157 can be used to ensure the local individual instructions to each memory device 120/memory controller 140, e.g., local writes, are completed.

FIGS. 3-6 illustrates a series of block diagrams for example embodiments of a high speed interface (HSI) 141 between a channel controller 143 and a bank arbiter 145 as shown in FIG. 1B. In at least one embodiment, the channel controller 143 can be integrated with the host 110 (as represented by the dashed lines). Alternatively, the channel controller 143 may be part of a module 111 connected to multiple memory devices 120-1, ..., 120-N as shown in FIG. 1B. As the reader will appreciate from reading this disclosure, the high speed interface (HSI) 141 can provide a status channel interface, or out-of-band (OOB) bus 155 between a processor in memory (PIM) device, e.g., memory device 120, and the channel controller 143, separate from a data bus 156 and control bus 154 between the memory device 120 and channel controller 143 and host 110 as shown in FIGS. 1A and 1B.

In one example, the HSI 141 is a first in first out (FIFO) style interface to the bank arbiter 145 of a processor in memory (PIM), e.g., memory device 120. The bank arbiter side can be a read FIFO interface with an empty bit, as well as clock and read signals, and a data out bus representing the bank, e.g., 121-1, ..., 121-M, and row address, as well as the operation type, activate, pre-charge, and/or auto refresh for the PIM 120. Control logic and sequencers as part of memory controller 140 of each bank 121-1, ..., 121-M (e.g., Bank 0, ..., Bank 7) can each have a FIFO coming into the bank arbiter 145 for pushing status information. The bank arbiter 145 pulls status information off each of these FIFOs (e.g., 16 FIFOs for 2 each by 8 banks) and pushes the status information back to the host 110 via the HSI 141 and channel controller 143. The FIFOs may be checked in round robin fashion using a counter.

The HSI or status channel interface, e.g., OOB, 141 can be a dedicated interface between the memory device 120 and the channel controller 143. By way of example, and not by way of limitation, this interface may be composed of sixteen (16) data outputs, 4 data strobes, and a rank enable input. In this example, when the memory device 120 is configured as a x64 DQ part, the status output pins are bused to each memory device 120-1, ..., 120-M on a given channel of the channel controller 143. For example, the channel controller 143 may be equipped with four (4) rank enable outputs per channel. Rank Enable zero (0) may be connected to all memory devices 120-1, ..., 120-M on the first rank, Rank Enable one (1) can be connected to all memory devices on the second rank, and so on as shown in the various example embodiments in FIGS. 3-6.

Figure 3:
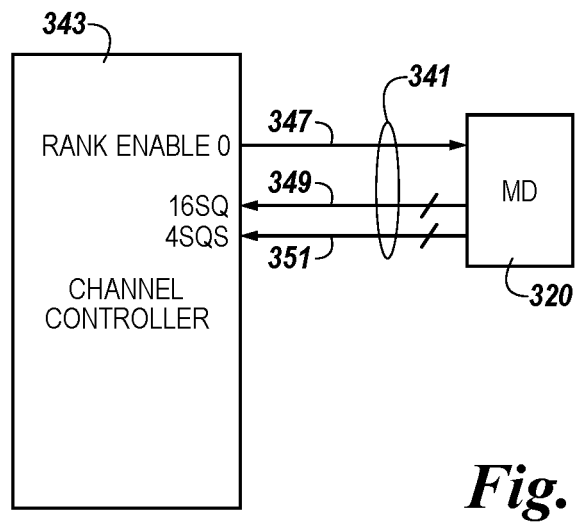
FIGS. 3-6 illustrate a number of embodiments for a high speed interface between a memory device and a host via a channel controller in accordance with the present disclosure.

FIG. 3 illustrates an example of an OOB bus (HSI) 341 between channel controller 343 and the bank arbiter 345 of a memory device 320 in the x64DQ one (1) rank configuration. As shown in the example of FIG. 3, one rank enable bit (pin) 347 is provided from the channel controller 343 to the memory device 320. In this example, 16 SQ (status outputs/pins) 349 are received from the memory device 320 for the channel and 4 SQS (status output strobes) 351 may be received.

Figure 4:
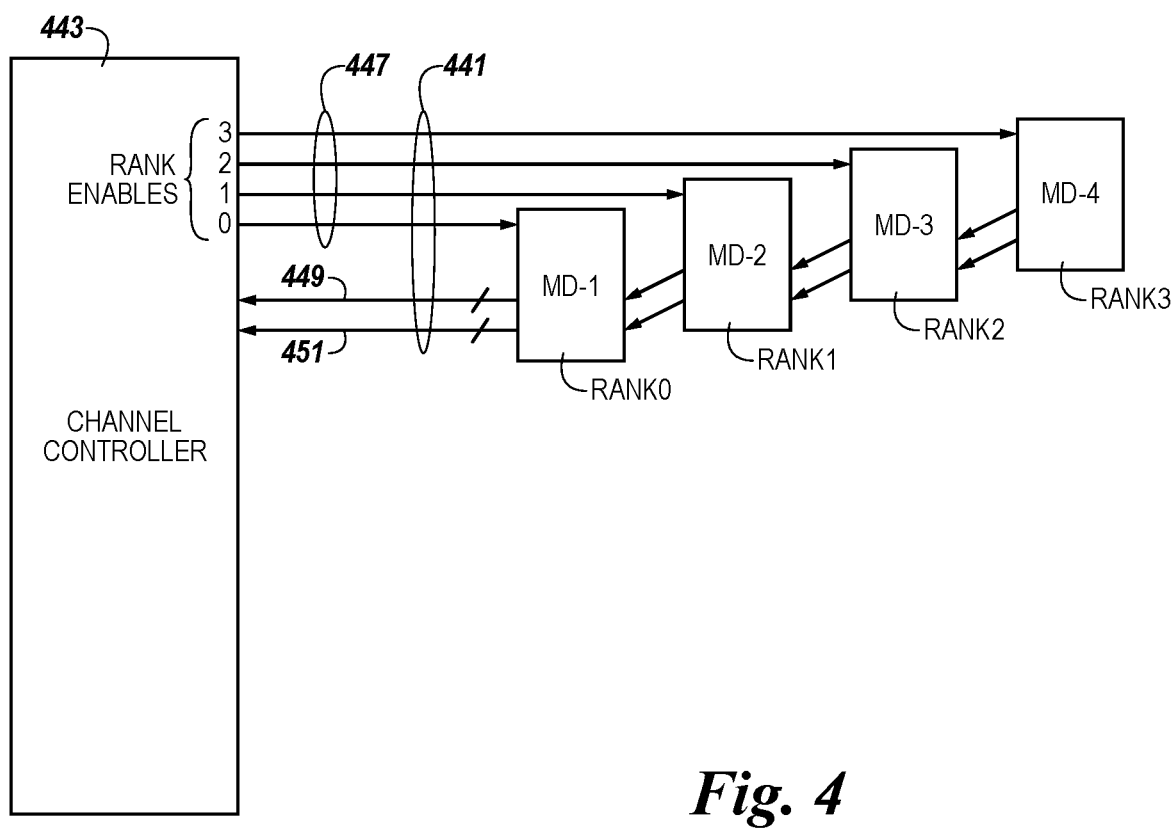

FIG. 4 illustrates an example of an OOB bus (HSI) 441 between channel controller 443 and the bank arbiter 445 of a memory device 420 in the x64DQ four (4) rank configuration. In this example, each of four (4) separate rank enable bits 447 are shown (0, 1, 2, and 3) on the channel controller 443 independently connected for one channel to four memory devices 420-1, 420-2, ..., 420-4. In this example, 16 SQ (status outputs) 449 are still received, but now from the four memory devices 420-1, 420-2, ..., 420-4 for the channel. Likewise, four (4) SQS (status output strobes) 451 are received on the channel for the four memory devices 420-1, 420-2, ..., 420-4.

In this case, the bandwidth of the status channel is divided just as the bandwidth of a double data rate (DDR) interface is divided, being effectively time domain multiplexed to avoid contention on the OOB 441. Each memory device 420, e.g., 420-1, 420-2, ..., 420-4, is granted access to the uni-directional status bus 441 in turn as its rank enable input is activated. When x64 mode is selected (fuse option or test option), each memory device 420 may transmit one data packet at an active edge of the rank enable input. Status output bits 449 can be streamed out, 1 bit per clock cycle, synchronized to the SQS strobe pins 451. The first bit may be a preamble bit. In one example, if the preamble bit is a logic 0, the memory device, e.g., 420-1, 420-2, . . . , 420-4, will transmit a 128 bit status message on the 16 DQs on eight (8) successive clocks. At the end of this message the SQ and SQS pins will transition to a tri-state mode, and the interface circuitry will wait for the next active edge on the rank enable input to transmit additional messages. If there are no messages waiting in a memory controller's (e.g., memory controller 440 of a given memory device 420) output queue, the sense of the preamble bit will be logic 1. The SQ and SQS drivers will be turned off on the next successive clock. The memory device will go back to waiting for another active edge on the rank enable input.

Figure 5:
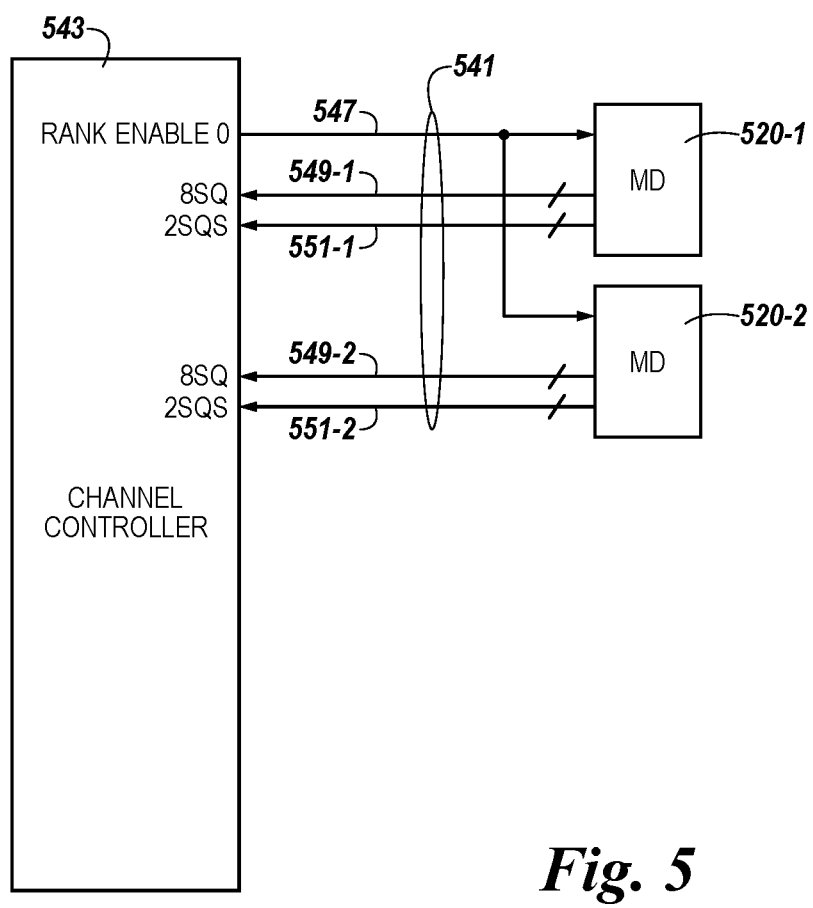

FIG. 5 illustrates an example of an OOB bus (HSI) 541 between channel controller 543 and the bank arbiter 545 of a memory device 520 in an x32DQ one (1) rank configuration. In the case of a x32 DQ configuration on the memory 520, the status channel can be split, as shown in FIG. 5, just as the data channel can be split, with half of the status outputs 540 (as well as half of the DQs and DQSs) going to each of the memory devices 520 in the architecture.

In this example, the rank enable inputs 547 for the first rank are all tied together. Thus they will all begin transmitting their status messages on the lower eight (8) SQ pins 549. The protocol is largely the same as in the x64 case, with data being sent following a preamble on successive active clock edges of the SQSs. One deviation from the prior example is that since the data bus is half as wide for each memory device 520, the message length will increase from eight (8) data clocks to sixteen (16), to accommodate the same 128 bit message size.

Figure 6:
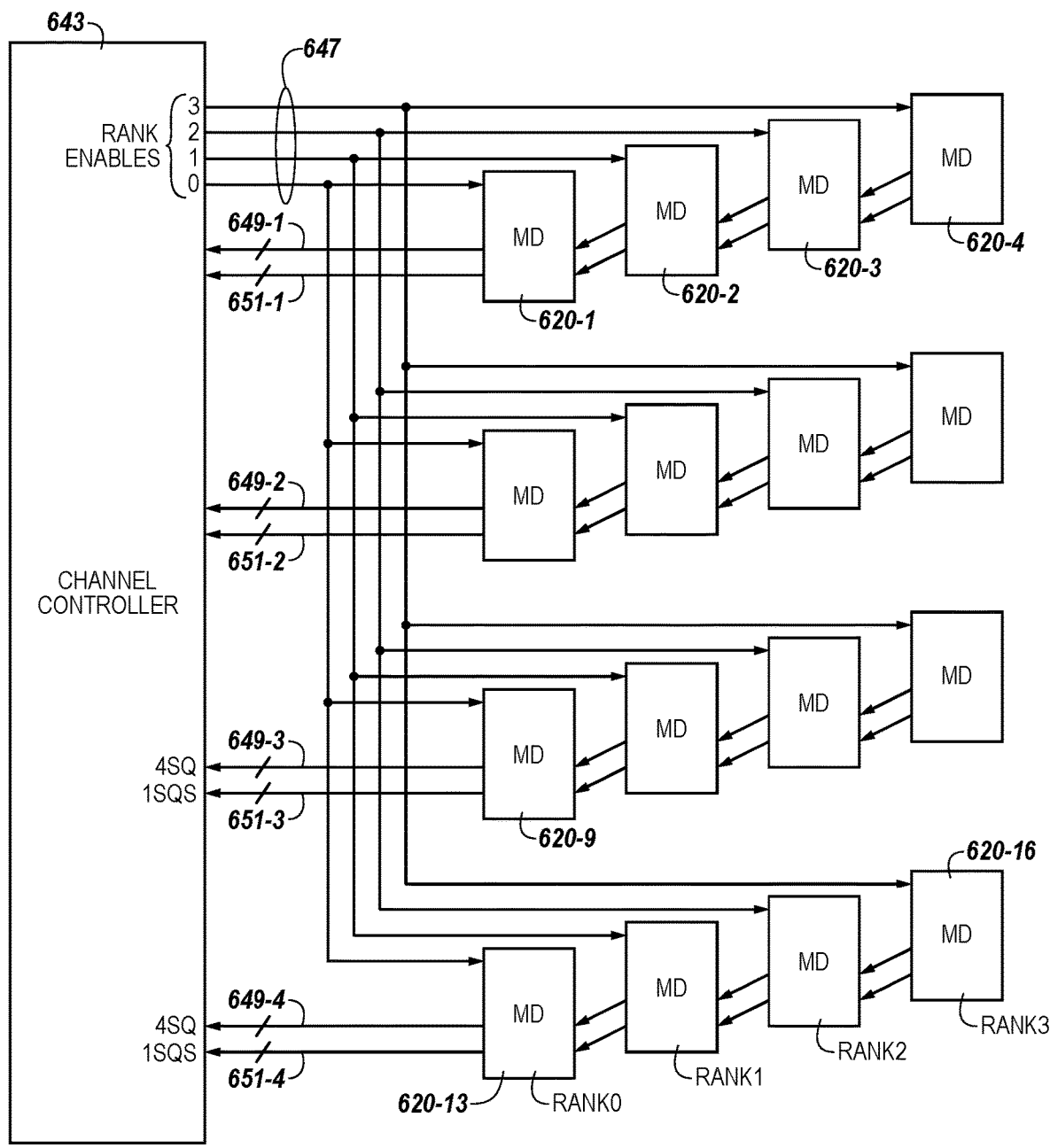

FIG. 6 illustrates an example of an OOB bus (HSI) 641 between channel controller 643 and the bank arbiter 645 of a memory device 620 in an x16 DQ four (4) rank configuration. In the case of a x16 DQ configuration on the memory 620, the status channel can be divided, as shown in FIG. 6, into four (4) parts with each memory device, e.g., 620-1, 620-5, 620-9 and 620-13, connected to the channel controller 643 via the lowest four (4) bits of a given memory device's SQ bus 649. In the example, the number of clock cycles per message again grows, now to thirty-two (32) to accommodate the same 128 bit message size.

Figure 7:
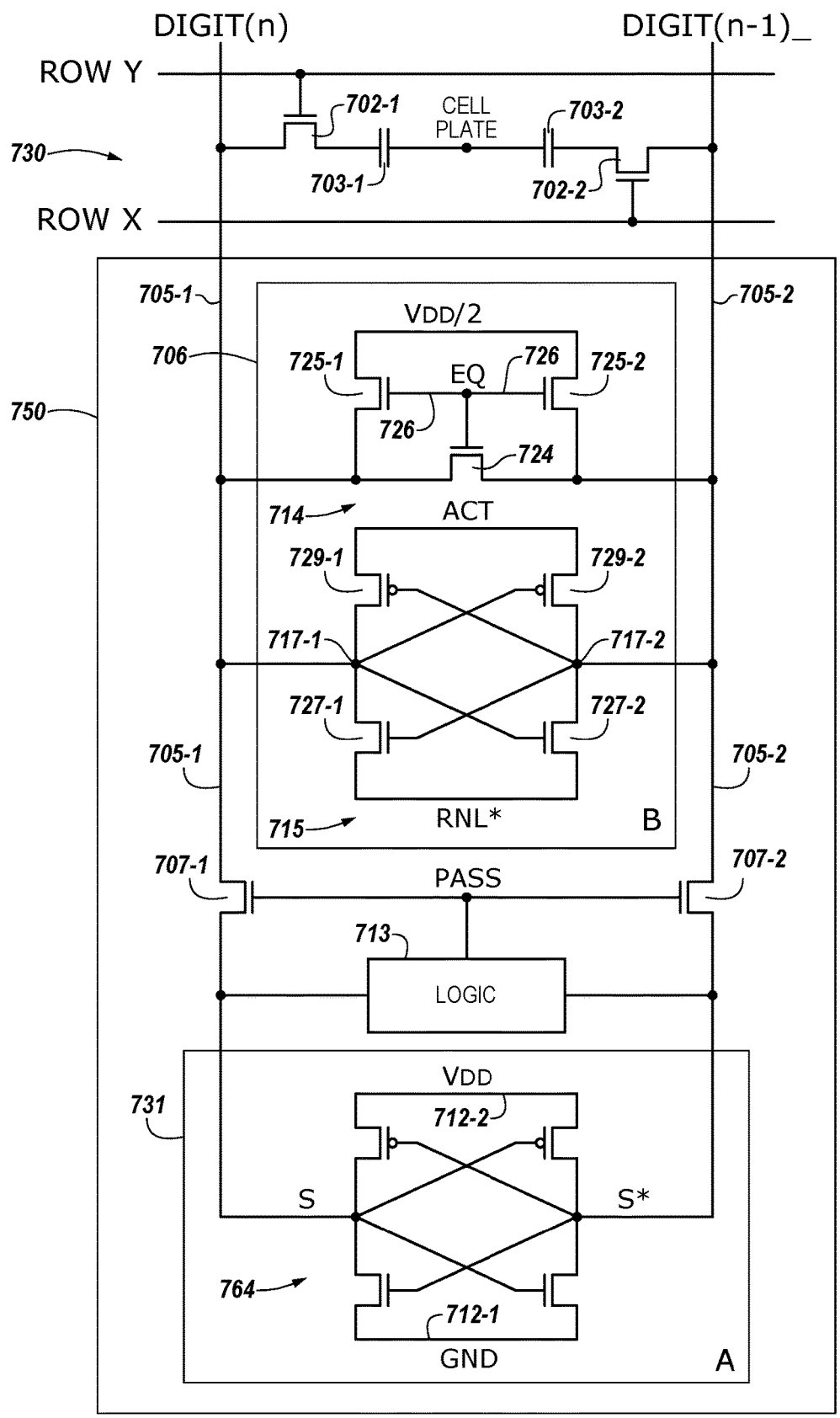
FIG. 7 is a schematic diagram illustrating sensing circuitry to a memory device in accordance with a number of embodiments of the present disclosure.

FIG. 7 is a schematic diagram illustrating sensing circuitry 750 in accordance with a number of embodiments of the present disclosure. The sensing circuitry 750 can correspond to sensing circuitry 150 shown in FIGS. 1A and 1B. The sense amplifier 706 of sensing circuitry 750 can correspond to sense amplifiers 206 shown in FIG. 2, and the compute component 731 of sensing circuitry 750 can correspond to compute component 231 shown in FIG. 2, for example.

A memory cell comprises a storage element (e.g., capacitor) and an access device (e.g., transistor). For instance, a first memory cell comprises transistor 702-1 and capacitor 703-1, and a second memory cell comprises transistor 702-2 and capacitor 703-2, etc. In this example, the memory array 730 is a DRAM array of 1T1C (one transistor one capacitor) memory cells. In a number of embodiments, the memory cells may be destructive read memory cells (e.g., reading the data stored in the cell destroys the data such that the data originally stored in the cell is refreshed after being read).

The cells of the memory array 730 can be arranged in rows coupled by word lines 704-X (Row X), 704-Y (Row Y), etc., and columns coupled by pairs of complementary sense lines (e.g., data lines DIGIT(n-1)/DIGIT(n-1)_, DIGIT(n)/DIGIT(n)_, DIGIT(n+1)/DIGIT(n+1)_). The individual sense lines corresponding to each pair of complementary sense lines can also be referred to as data lines 705-1 (D) and 705-2 (D_) respectively. Although only one pair of complementary data lines are shown in FIG. 7, embodiments of the present disclosure are not so limited, and an array of memory cells can include additional columns of memory cells and/or data lines (e.g., 4,096, 8,192, 16,384, etc.).

Memory cells can be coupled to different data lines and/or word lines. For example, a first source/drain region of a transistor 702-1 can be coupled to data line 705-1 (D), a second source/drain region of transistor 702-1 can be coupled to capacitor 703-1, and a gate of a transistor 702-1 can be coupled to word line 704-X. A first source/drain region of a transistor 702-2 can be coupled to data line 705-2 (D_), a second source/drain region of transistor 702-2 can be coupled to capacitor 703-2, and a gate of a transistor 702-2 can be coupled to word line 704-Y. The cell plate, as shown in FIG. 7, can be coupled to each of capacitors 703-1 and 703-2. The cell plate can be a common node to which a reference voltage (e.g., ground) can be applied in various memory array configurations.

The memory array 730 is coupled to sensing circuitry 750 in accordance with a number of embodiments of the present disclosure. In this example, the sensing circuitry 750 comprises a sense amplifier 706 and a compute component 731 corresponding to respective columns of memory cells (e.g., coupled to respective pairs of complementary data lines). The sense amplifier 706 can be coupled to the pair of complementary sense lines 705-1 and 705-2. The compute component 731 can be coupled to the sense amplifier 706 via pass gates 707-1 and 707-2. The gates of the pass gates 707-1 and 707-2 can be coupled to logical operation selection logic 713.

The logical operation selection logic 713 can be configured to include pass gate logic for controlling pass gates that couple the pair of complementary sense lines un-transposed between the sense amplifier 706 and the compute component 731 (as shown in FIG. 7) and/or swap gate logic for controlling swap gates that couple the pair of complementary sense lines transposed between the sense amplifier 706 and the compute component 731 (as is discussed later with respect to FIG. 6, for example). The logical operation selection logic 713 can also be coupled to the pair of complementary sense lines 705-1 and 705-2. The logical operation selection logic 713 can be configured to control continuity of pass gates 707-1 and 707-2 based on a selected logical operation, as described in detail below for various configurations of the logical operation selection logic 713.

The sense amplifier 706 can be operated to determine a data value (e.g., logic state) stored in a selected memory cell. The sense amplifier 706 can comprise a cross coupled latch, which can be referred to herein as a primary latch. In the example illustrated in FIG. 7, the circuitry corresponding to sense amplifier 706 comprises a latch 715 including four transistors coupled to a pair of complementary data lines D 705-1 and D_ 705-2. However, embodiments are not limited to this example. The latch 715 can be a cross coupled latch (e.g., gates of a pair of transistors, such as n-channel transistors (e.g., NMOS transistors) 727-1 and 727-2 are cross coupled with the gates of another pair of transistors, such as p-channel transistors (e.g., PMOS transistors) 729-1 and 729-2). The cross coupled latch 715 comprising transistors 727-1, 727-2, 729-1, and 729-2 can be referred to as a primary latch.

In operation, when a memory cell is being sensed (e.g., read), the voltage on one of the data lines 705-1 (D) or 705-2 (D_) will be slightly greater than the voltage on the other one of data lines 705-1 (D) or 705-2 (D_). An ACT signal and the RNL* signal can be driven low to enable (e.g., fire) the sense amplifier 706. The data lines 705-1 (D) or 705-2 (D_) having the lower voltage will turn on one of the PMOS transistor 729-1 or 729-2 to a greater extent than the other of PMOS transistor 729-1 or 729-2, thereby driving high the data line 705-1 (D) or 705-2 (D_) having the higher voltage to a greater extent than the other data line 705-1 (D) or 705-2 (D_) is driven high.

Similarly, the data line 705-1 (D) or 705-2 (D_) having the higher voltage will turn on one of the NMOS transistor 727-1 or 727-2 to a greater extent than the other of the NMOS transistor 727-1 or 727-2, thereby driving low the data line 705-1 (D) or 705-2 (D_) having the lower voltage to a greater extent than the other data line 705-1 (D) or 705-2 (D_) is driven low. As a result, after a short delay, the data line 705-1 (D) or 705-2 (D_) having the slightly greater voltage is driven to the voltage of the supply voltage $V_{CC}$ through source transistor 711, and the other data line 705-1 (D) or 705-2 (D_) is driven to the voltage of the reference voltage (e.g., ground) through the sink transistor 713. Therefore, the cross coupled NMOS transistors 727-1 and 727-2 and PMOS transistors 729-1 and 729-2 serve as a sense amplifier pair, which amplify the differential voltage on the data lines 705-1 (D) and 705-2 (D_) and operate to latch a data value sensed from the selected memory cell. As used herein, the cross coupled latch of sense amplifier 706 may be referred to as a primary latch 715.

Embodiments are not limited to the sense amplifier 706 configuration illustrated in FIG. 7. As an example, the sense amplifier 706 can be current-mode sense amplifier and/or single-ended sense amplifier (e.g., sense amplifier coupled to one data line). Also, embodiments of the present disclosure are not limited to a folded data line architecture such as that shown in FIG. 7.

The sense amplifier 706 can, in conjunction with the compute component 731, be operated to perform various logical operations using data from an array as input. In a number of embodiments, the result of a logical operation can be stored back to the array without transferring the data via a data line address access (e.g., without firing a column decode signal such that data is transferred to circuitry external from the array and sensing circuitry via local I/O lines). As such, a number of embodiments of the present disclosure can enable performing logical operations and compute functions associated therewith using less power than various previous approaches. Additionally, since a number of embodiments eliminate the need to transfer data across I/O lines in order to perform compute functions (e.g., between memory and discrete processor), a number of embodiments can enable an increased parallel processing capability as compared to previous approaches.

The sense amplifier 706 can further include equilibration circuitry 714, which can be configured to equilibrate the data lines 705-1 (D) and 705-2 (D). In this example, the equilibration circuitry 714 comprises a transistor 724 coupled between data lines 705-1 (D) and 705-2 (D). The equilibration circuitry 714 also comprises transistors 725-1 and 725-2 each having a first source/drain region coupled to an equilibration voltage (e.g., $V_{DD}/2$), where $V_{DD}$ is a supply voltage associated with the array. A second source/drain region of transistor 725-1 can be coupled data line 705-1 (D), and a second source/drain region of transistor 725-2 can be coupled data line 705-2 (D). Gates of transistors 724, 725-1, and 725-2 can be coupled together, and to an equilibration (EQ) control signal line 726. As such, activating EQ enables the transistors 724, 725-1, and 725-2, which effectively shorts data lines 705-1 (D) and 705-2 (D_) together and to the an equilibration voltage (e.g., $V_{CC}/2$).

Although FIG. 7 shows sense amplifier 706 comprising the equilibration circuitry 714, embodiments are not so limited, and the equilibration circuitry 714 may be implemented discretely from the sense amplifier 706, implemented in a different configuration than that shown in FIG. 7, or not implemented at all.

As described further below, in a number of embodiments, the sensing circuitry (e.g., sense amplifier 706 and compute component 731) can be operated to perform a selected logical operation and initially store the result in one of the sense amplifier 706 or the compute component 731 without transferring data from the sensing circuitry via an I/O line (e.g., without performing a data line address access via activation of a column decode signal, for instance).

Performance of logical operations (e.g., Boolean logical functions involving data values) is fundamental and commonly used. Boolean logic functions are used in many higher level functions. Consequently, speed and/or power efficiencies that can be realized with improved logical operations, which can translate into speed and/or power efficiencies of higher order functionalities. Described herein are apparatuses and methods for performing logical operations without transferring data via an input/output (I/O) line and/or without transferring data to a control component external to the array. Depending on memory array architecture, the apparatuses and methods for performing the logical operations may not require amplification of a sense line (e.g., data line, digit line, bit line) pair.

As shown in FIG. 7, the compute component 731 can also comprise a latch, which can be referred to herein as a secondary latch 764. The secondary latch 764 can be configured and operated in a manner similar to that described above with respect to the primary latch 715, with the exception that the pair of cross coupled p-channel transistors (e.g., PMOS transistors) comprising the secondary latch can have their respective sources coupled to a supply voltage (e.g., $V_{DD}$), and the pair of cross coupled n-channel transistors (e.g., NMOS transistors) of the secondary latch can have their respective sources selectively coupled to a reference voltage (e.g., ground), such that the secondary latch is continuously enabled. The configuration of the compute component is not limited to that shown in FIG. 7 at 731, and various other embodiments are described further below.

Figure 8:
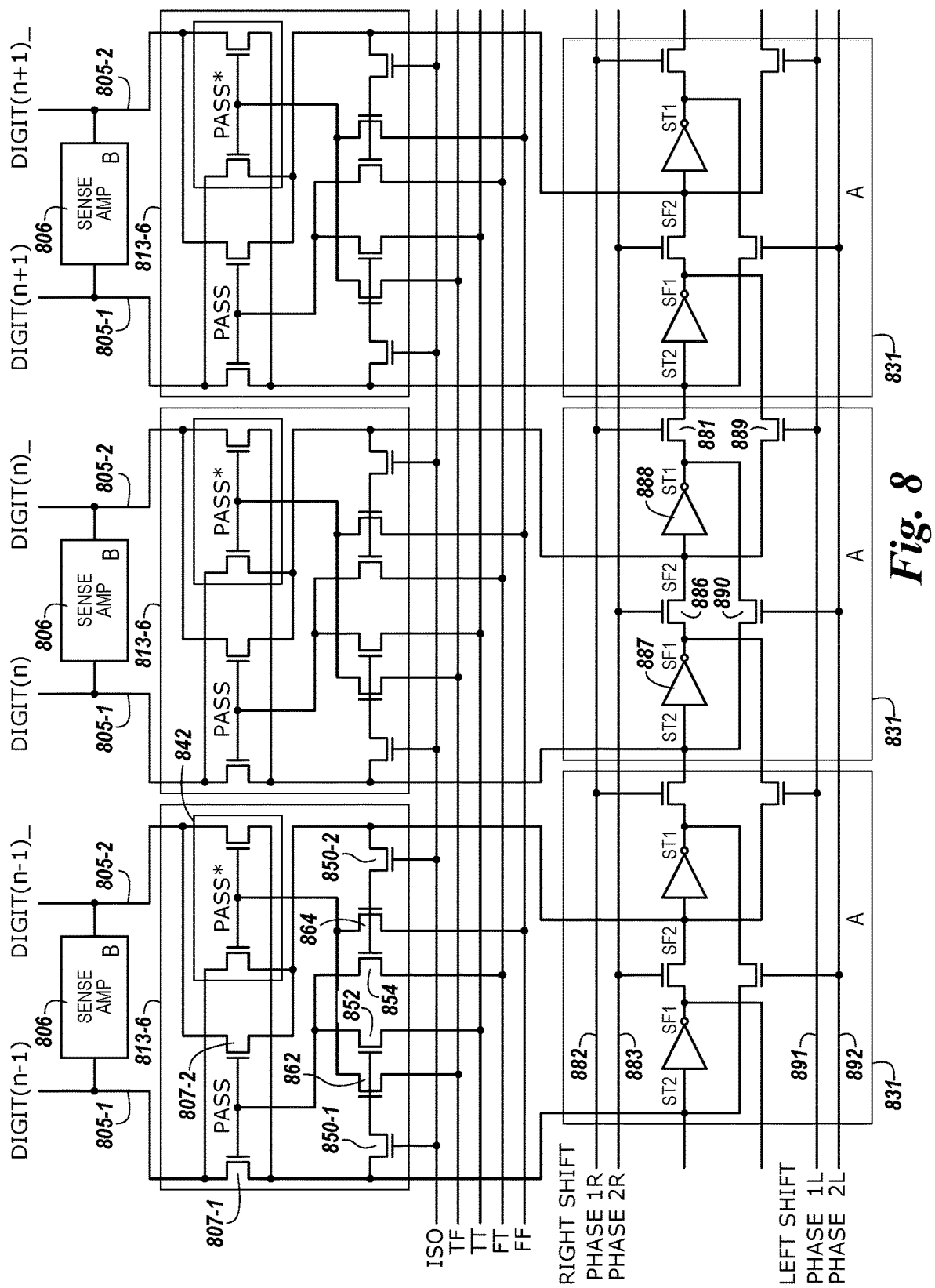
FIG. 8 is a schematic diagram illustrating sensing circuitry to a memory device in accordance with a number of embodiments of the present disclosure.

FIG. 8 is a schematic diagram illustrating sensing circuitry capable of implementing an XOR logical operation in accordance with a number of embodiments of the present disclosure. FIG. 8 shows a sense amplifier 806 coupled to a pair of complementary sense lines 805-1 and 805-2, and a compute component 831 coupled to the sense amplifier 806 via pass gates 807-1 and 807-2. The sense amplifier 806 shown in FIG. 8 can correspond to sense amplifier 706 shown in FIG. 7. The compute component 831 shown in FIG. 8 can correspond to compute component 231 shown in FIG. 2, for example. The logical operation selection logic 813 shown in FIG. 8 can correspond to logical operation selection logic 713 shown in FIG. 7, for example.

The gates of the pass gates 807-1 and 807-2 can be controlled by a logical operation selection logic signal, Pass. For example, an output of the logical operation selection logic can be coupled to the gates of the pass gates 807-1 and 807-2. The compute component 831 can comprise a loadable shift register configured to shift data values left and right.

According to the embodiment illustrated in FIG. 8, the compute components 831 can comprise respective stages (e.g., shift cells) of a loadable shift register configured to shift data values left and right. For example, as illustrated in FIG. 8, each compute component 831 (e.g., stage) of the shift register comprises a pair of right-shift transistors 881 and 886, a pair of left-shift transistors 889 and 890, and a pair of inverters 887 and 888. The signals PHASE 1R, PHASE 2R, PHASE 1L, and PHASE 2L can be applied to respective control lines 882, 883, 891 and 892 to enable/disable feedback on the latches of the corresponding compute components 831 in association with performing logical operations and/or shifting data in accordance with embodiments described herein.

The sensing circuitry shown in FIG. 8 also shows a logical operation selection logic 813 coupled to a number of logic selection control input control lines, including ISO, TF, TT, FT, and FF. Selection of a logical operation from a plurality of logical operations is determined from the condition of logic selection control signals on the logic selection control input control lines, as well as the data values present on the pair of complementary sense lines 805-1 and 805-2 when the isolation transistors are enabled via the ISO control signal being asserted.

According to various embodiments, the logical operation selection logic 813 can include four logic selection transistors: logic selection transistor 862 coupled between the gates of the swap transistors 842 and a TF signal control line, logic selection transistor 852 coupled between the gates of the pass gates 807-1 and 807-2 and a TT signal control line, logic selection transistor 854 coupled between the gates of the pass gates 807-1 and 807-2 and a FT signal control line, and logic selection transistor 864 coupled between the gates of the swap transistors 842 and a FF signal control line. Gates of logic selection transistors 862 and 852 are coupled to the true sense line through isolation transistor 850-1 (having a gate coupled to an ISO signal control line). Gates of logic selection transistors 864 and 854 are coupled to the complementary sense line through isolation transistor 850-2 (also having a gate coupled to an ISO signal control line).

Data values present on the pair of complementary sense lines 805-1 and 805-2 can be loaded into the compute component 831 via the pass gates 807-1 and 807-2. The compute component 831 can comprise a loadable shift register. When the pass gates 807-1 and 807-2 are OPEN, data values on the pair of complementary sense lines 805-1 and 805-2 are passed to the compute component 831 and thereby loaded into the loadable shift register. The data values on the pair of complementary sense lines 805-1 and 805-2 can be the data value stored in the sense amplifier 806 when the sense amplifier is fired. The logical operation selection logic signal, Pass, is high to OPEN the pass gates 807-1 and 807-2.

The ISO, TF, TT, FT, and FF control signals can operate to select a logical function to implement based on the data value ("B") in the sense amplifier 806 and the data value ("A") in the compute component 831. In particular, the ISO, TF, TT, FT, and FF control signals are configured to select the logical function to implement independent from the data value present on the pair of complementary sense lines 805-1 and 805-2 (although the result of the implemented logical operation can be dependent on the data value present on the pair of complementary sense lines 805-1 and 805-2. That is, the ISO, TF, TT, FT, and FF control signals select the logical operation to implement directly since the data value present on the pair of complementary sense lines 805-1 and 805-2 is not passed through logic to operate the gates of the pass gates 807-1 and 807-2.

Additionally, FIG. 8 shows swap transistors 842 configured to swap the orientation of the pair of complementary sense lines 805-1 and 805-2 between the sense amplifier 813-7 and the compute component 831. When the swap transistors 842 are OPEN, data values on the pair of complementary sense lines 805-1 and 805-2 on the sense amplifier 806 side of the swap transistors 842 are oppositely-coupled to the pair of complementary sense lines 805-1 and 805-2 on the compute component 831 side of the swap transistors 842, and thereby loaded into the loadable shift register of the compute component 831.

The logical operation selection logic signal Pass can be activated (e.g., high) to OPEN the pass gates 807-1 and 807-2 (e.g., conducting) when the ISO control signal line is activated and either the TT control signal is activated (e.g., high) with data value on the true sense line is "1" or the FT control signal is activated (e.g., high) with the data value on the complement sense line is "1."

The data value on the true sense line being a "1" OPENs logic selection transistors 852 and 862. The data value on the complimentary sense line being a "1" OPENs logic selection transistors 854 and 864. If the ISO control signal or either the respective TT/FT control signal or the data value on the corresponding sense line (e.g., sense line to which the gate of the particular logic selection transistor is coupled) is not high, then the pass gates 807-1 and 807-2 will not be OPENed by a particular logic selection transistor.

The logical operation selection logic signal PassF can be activated (e.g., high) to OPEN the swap transistors 842 (e.g., conducting) when the ISO control signal line is activated and either the TF control signal is activated (e.g., high) with data value on the true sense line is "1," or the FF control signal is activated (e.g., high) with the data value on the complement sense line is "1." If either the respective control signal or the data value on the corresponding sense line (e.g., sense line to which the gate of the particular logic selection transistor is coupled) is not high, then the swap transistors 842 will not be OPENed by a particular logic selection transistor.

The Pass* control signal is not necessarily complementary to the Pass control signal. It is possible for the Pass and Pass* control signals to both be activated or both be deactivated at the same time. However, activation of both the Pass and Pass* control signals at the same time shorts the pair of complementary sense lines together, which may be a disruptive configuration to be avoided.

The sensing circuitry illustrated in FIG. 8 is configured to select one of a plurality of logical operations to implement directly from the four logic selection control signals (e.g., logical operation selection is not dependent on the data value present on the pair of complementary sense lines). Some combinations of the logic selection control signals can cause both the pass gates 807-1 and 807-2 and swap transistors 842 to be OPEN at the same time, which shorts the pair of complementary sense lines 805-1 and 805-2 together. According to a number of embodiments of the present disclosure, the logical operations which can be implemented by the sensing circuitry illustrated in FIG. 8 can be the logical operations summarized in the logic tables shown in FIG. 9.

FIG. 9 is a logic table illustrating selectable logic operation results implemented by a sensing circuitry shown in FIG. 8 in accordance with a number of embodiments of the present disclosure. The four logic selection control signals (e.g., TF, TT, FT, and FF), in conjunction with a particular data value present on the complementary sense lines, can be used to select one of plural logical operations to implement involving the starting data values stored in the sense amplifier 806 and compute component 831. The four control signals, in conjunction with a particular data value present on the complementary sense lines, controls the continuity of the pass gates 807-1 and 807-2 and swap transistors 842, which in turn affects the data value in the compute component 831 and/or sense amplifier 806 before/after firing. The capability to selectably control continuity of the swap transistors 842 facilitates implementing logical operations involving inverse data values (e.g., inverse operands and/or inverse result), among others.

Logic Table 9-1 illustrated in FIG. 9 shows the starting data value stored in the compute component 631 shown in column A at 944, and the starting data value stored in the sense amplifier 606 shown in column B at 945. The other 3 column headings in Logic Table 9-1 refer to the continuity of the pass gates 807-1 and 807-2, and the swap transistors 842, which can respectively be controlled to be OPEN or CLOSED depending on the state of the four logic selection control signals (e.g., TF, TT, FT, and FF), in conjunction with a particular data value present on the pair of complementary sense lines 805-1 and 805-2. The "Not Open" column corresponds to the pass gates 807-1 and 807-2 and the swap transistors 842 both being in a non-conducting condition, the "Open True" corresponds to the pass gates 807-1 and 807-2 being in a conducting condition, and the "Open Invert" corresponds to the swap transistors 842 being in a conducting condition. The configuration corresponding to the pass gates 807-1 and 807-2 and the swap transistors 842 both being in a conducting condition is not reflected in Logic Table 8-1 since this results in the sense lines being shorted together.

Via selective control of the continuity of the pass gates 807-1 and 807-2 and the swap transistors 842, each of the three columns of the upper portion of Logic Table 9-1 can be combined with each of the three columns of the lower portion of Logic Table 9-1 to provide 3×3=9 different result combinations, corresponding to nine different logical operations, as indicated by the various connecting paths shown at 975. The nine different selectable logical operations that can be implemented by the sensing circuitry 850 are summarized in Logic Table 9-2 illustrated in FIG. 9, including an XOR logical operation.

The columns of Logic Table 9-2 illustrated in FIG. 9 show a heading 980 that includes the state of logic selection control signals. For example, the state of a first logic selection control signal is provided in row 976, the state of a second logic selection control signal is provided in row 977, the state of a third logic selection control signal is provided in row 978, and the state of a fourth logic selection control signal is provided in row 979. The particular logical operation corresponding to the results is summarized in row 947.

While example embodiments including various combinations and configurations of sensing circuitry, sense amplifiers, compute component, dynamic latches, isolation devices, and/or shift circuitry have been illustrated and described herein, embodiments of the present disclosure are not limited to those combinations explicitly recited herein. Other combinations and configurations of the sensing circuitry, sense amplifiers, compute component, dynamic latches, isolation devices, and/or shift circuitry disclosed herein are expressly included within the scope of this disclosure.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
 a memory device, wherein the memory device includes:
  an array of memory cells;
  sensing circuitry coupled to the array, the sensing circuitry including a sense amplifier and a compute component configured to implement logical operations; and
  a controller coupled to the array and sensing circuitry, the controller configured to:
   receive a block of instructions, the block of instructions including a set of instructions for at least one of a gather operation and a scatter operation;
   change vector references in the received block of instructions by reading an index (idx) vector array block by block, the idx vector array stored in the memory device; and
   subdivide the block of instructions so that the at least one of the gather operation and the scatter operation can be executed locally on the memory device based on the subdivided block of instructions.

2. An apparatus, comprising:
 a channel controller; and
 a memory device coupled to the channel controller, wherein the memory device includes:
  an array of memory cells, wherein the array of memory cells includes a plurality of banks of memory cells;
  sensing circuitry coupled to the array, the sensing circuitry including a sense amplifier and a compute component configured to implement logical operations; and
  a memory controller coupled to the array and the sensing circuitry; and
 wherein the channel controller is configured to:
  receive a block of instructions to write to the array, the block instructions including individual instructions for at least one of a gather operation and a scatter operation;

send individual instructions to the memory device;
control the memory controller such that at least one of the gather operation and the scatter operation is executed on the memory device based on a corresponding one of the individual instructions;
store a buffer of index (idx) data locally among a plurality of banks of the memory device;
change vector references in the received block of instructions by reading an idx vector array block by block, the idx vector array stored in the memory device; and
group requests together by locality among the plurality of banks so that array and sensing circuitry execution elements can gather and return requests to the channel controller.

3. The apparatus of claim 2, wherein:
the array of memory cells includes a plurality of banks of memory cells, wherein each bank includes a respective memory controller, array, and sensing circuity;
wherein the channel controller is coupled to each of the respective memory controllers; and
wherein the memory controller is configured to:
subdivide the block of instructions to manage execution of local individual instructions on banks in the memory device;
monitor completion of the gather operation to ensure in-order execution of the gather operation and to ensure that other memory device operations are complete before starting the gather operation among the plurality of banks of memory cells.

4. The apparatus of claim 2, wherein the channel controller is configured to:
stream a collection of data from the plurality of banks by iterating through the idx array; and
allocate local buffers to hold:
a section of the idx array;
intermediate results from x vector reads; and
merged results for a y-target vector.

5. The apparatus of claim 2, wherein the apparatus includes a plurality of memory devices coupled to the channel controller, wherein the channel controller is configured to:
read a buffer of indices in the idx vector array stored to a local buffer;
store the buffer of indices to a local idx buffer;
bin independent bank command buffers for the plurality of banks; and
create individual instructions to communicate to respective ones of the plurality of memory devices.

6. The apparatus of claim 5, wherein the channel controller communicates with the plurality of memory devices via an out-of-band bus.

7. The apparatus of claim 2, wherein the channel controller is configured to:
perform a scatter operation by:
reading locations to be written to from the idx vector and data to be written from x vectors into a target y vector; and
grouping write requests by locality.

8. The apparatus of claim 7, wherein the channel controller is configured to:
receive a stream of instructions at the memory device to be executed, wherein the stream of instructions contains embedded data and specific locations in the plurality of banks;
send the stream of instructions to the plurality of banks to executed by the plurality of banks; and
only receive notification, using an out-of-band bus configured to provide status information of the memory device, when writes are completed.

9. The apparatus of claim 2, wherein an out-of-band bus is configured to provide a word of information to the channel controller that includes a status update.

10. The apparatus of claim 2, wherein the memory controller is configured to execute the block instruction to cause the sensing circuitry to perform the gather operation locally on a plurality of banks on the memory device.

11. The apparatus of claim 2, wherein the channel controller is configured to:
send block instructions for the gather operation to a plurality of memory devices to be performed locally on each respective memory device; and
receive return requested data via an out-of-band (OOB) bus to merge collected results.

12. The apparatus of claim 11, wherein a data bus and the out-of-band (OOB) bus are configured to be a same type interface, the data bus being configured to have a greater bit-width than the out-of-band (OOB) bus, and wherein the data bus is a 64-bit Double Data Rate 4 (DDR4) type Physical (PHY) interface.

13. The apparatus of claim 11, wherein the out-of-band (OOB) bus is configured to:
use a data strobe signal that is distinct from a data strobe signal used by a data bus;
use a same clock signal as the data bus; and
use a same clock enable signal as the data bus.

14. A method, comprising:
receiving individual instructions associated with at least one of a gather operation and a scatter operation at respective banks in a plurality of banks on a memory device of a plurality of memory devices;
controlling execution of the individual instructions associated with the at least one of the gather operation and the scatter operation on the memory device by a channel controller;
executing the individual instructions using a memory controller on the memory device to perform the at least one of the gather operation and the scatter operation on the respective banks; and
binning indices from an index vector to a plurality of bank command buffers local to the channel controller for each of the plurality of memory devices.

15. The method of claim 14, wherein the method comprises sending individual instructions to the plurality of banks to perform the gather operation.

16. The method of claim 15, wherein the method comprises:
receiving via an out-of-band (OOB) bus requested data from the gather operation from the plurality of memory devices to the channel controller; and
merging the received requested data into a local buffer associated with the channel controller.

17. The method of claim 16, wherein the method further comprises operating the plurality of memory devices to perform a scatter operation, wherein the method comprises:
reading locations to be written to from command instructions received from the idx vector and data to be written from an x-source vector using sensing circuitry associated with an array of memory cells on each respective bank of the plurality of memory devices to perform the scatter operation local to the bank.

18. The method of claim 17, wherein the method comprises:
grouping, via the channel controller, write requests by locality for respective banks among the plurality of memory devices;
providing individual instructions associated with the scatter operation to respective banks of the plurality of memory devices such that the individual instructions can be executed locally by respective banks using a memory controller of the bank; and
communicating completion of write requests associated with the scatter operation to the channel controller from respective banks using the OOB bus.

* * * * *